US010381318B2

(12) United States Patent
Yagyu

(10) Patent No.: US 10,381,318 B2
(45) Date of Patent: Aug. 13, 2019

(54) METHOD OF MANUFACTURING SEMICONDUCTOR DEVICE

(71) Applicant: Renesas Electronics Corporation, Tokyo (JP)

(72) Inventor: Yuki Yagyu, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/971,136

(22) Filed: May 4, 2018

(65) Prior Publication Data

US 2018/0350759 A1    Dec. 6, 2018

(30) Foreign Application Priority Data

Jun. 1, 2017 (JP) .................................. 2017-109399

(51) Int. Cl.
*H01L 21/00* (2006.01)
*H01L 23/00* (2006.01)
(Continued)

(52) U.S. Cl.
CPC .............. *H01L 24/03* (2013.01); *H01L 21/56* (2013.01); *H01L 24/05* (2013.01); *H01L 24/83* (2013.01);
(Continued)

(58) Field of Classification Search
CPC .............. G02F 1/133528; G02F 1/1368; G02F 1/136213; G02F 1/13624; G02F 1/136286; G02F 2001/133614; G02F 1/13363; G02F 1/133617; G02F 1/133621; G02F 2201/121; G02F 2201/123; G02F 1/133536; G02F 1/133603; G02F 1/136227; G02F 1/133553; G02F 1/133502; G02F 2001/133562; G02F 2001/133638; G02F 2201/50; G09G 2320/0252; G09G 2340/16; G09G 2310/024; G09G 3/342; G09G 2320/0261; G09G 2340/0435; G09G 3/3648; G09G 2330/021; G09G 2300/0842; G09G 2300/0852; G09G 2320/028; G09G 3/3659; G09G 2320/106; G09G 2300/0426; G02B 5/3033; G02B 1/14; G02B 5/30; G02B 5/3083; G02B 5/3016; G02B 5/3025; G02B 5/305; G02B 6/0051; G02B 6/0056; G02B 5/22; G02B 6/0055; G02B 1/04;
(Continued)

(56) References Cited

U.S. PATENT DOCUMENTS 8,063,489 B2   11/2011   Shigihara et al.

FOREIGN PATENT DOCUMENTS

JP    2010-157683 A    7/2010

*Primary Examiner* — Robert G Bachner
(74) *Attorney, Agent, or Firm* — McDermott Will & Emery LLP

(57) ABSTRACT

The present invention: makes it possible to improve the reliability of a semiconductor device; and provides a method of manufacturing the semiconductor device comprising the steps of (a) providing a semiconductor wafer having a pad electrode, a first conductive layer comprised of copper, a photoresist film, and a second conductive layer comprised of gold, (b) forming a protective film comprised of iodine on the surface of the second conductive layer, (c) removing the photoresist film, (d) irradiating the protective film with argon ions and removing the protective film, and (e) bringing a part of a bonding wire into contact with the surface of the second conductive layer.

20 Claims, 18 Drawing Sheets

(51) Int. Cl.
*H01L 21/56* (2006.01)
*H01L 21/78* (2006.01)

(52) U.S. Cl.
CPC .............. *H01L 24/85* (2013.01); *H01L 21/78* (2013.01); *H01L 2224/04042* (2013.01); *H01L 2224/85013* (2013.01)

(58) Field of Classification Search
CPC ........ G02B 1/08; G02B 1/105; G02B 5/0278; G02B 5/201; G02B 5/26; G02B 5/3041; G02B 6/0053; G02B 1/10; G02B 1/11; G02B 1/18; G02B 5/0247; G02B 5/208; G02B 6/005; G02B 6/0073; G02B 1/111; G02B 1/118; H01L 2924/0002; H01L 21/0217; H01L 21/02274; H01L 21/0228; H01L 27/1225; H01L 2924/00; H01L 21/02211; H01L 27/12; H01L 51/0097; C08L 1/12; C08L 67/02; C08L 1/10; C08L 1/14; C23C 16/345; C23C 16/45553; C23C 16/045; C23C 16/45536; C23C 16/0272; C23C 16/26; B32B 2307/42; B32B 23/20; B32B 2457/20; B32B 7/12
See application file for complete search history.

UNDER IODINE ATMOSPHERE

METHOD OF MANUFACTURING SEMICONDUCTOR DEVICE

CROSS-REFERENCE TO RELATED APPLICATIONS

The disclosure of Japanese Patent Application No. 2017-109399 filed on Jun. 1, 2017 including the specification, drawings and abstract is incorporated herein by reference in its entirety.

BACKGROUND

The present invention relates to: a method of manufacturing a semiconductor device; in particular a technology effectively applicable to a method of manufacturing a semiconductor device formed by connecting a wire with a surface of a pad electrode through a conductive layer.

A technology of adopting a palladium film as a seed metal film and using an etching liquid of an iodine series as the etching liquid is disclosed in Japanese Unexamined Patent Application Publication No. 2010-157683 (Patent Literature 1).

CITATION LIST

Patent Literature

Patent Literature 1: Japanese Unexamined Patent Application Publication No. 2010-157683

SUMMARY

For example, there is a semiconductor device formed by electrically connecting a terminal of a base material such as a lead frame or a wiring board and a pad electrode of a semiconductor chip mounted on the base material with each other via a bonding wire. Specifically, there is a semiconductor device formed by connecting a bonding wire with a pad electrode via a conductive layer formed beforehand over the pad electrode.

According to studies by the present inventors, it has been found that the bonding reliability (bonding strength) of a bonding wire deteriorates depending on the configuration and forming method of a conductive layer. Consequently, the reliability of a semiconductor device is desired to improve by devising the configuration and forming method of a conductive layer.

The other problems and novel features will be obvious from the descriptions and attached drawings in the present specification.

A method of manufacturing a semiconductor device according to an embodiment includes a step of (a) providing a semiconductor wafer having a pad electrode, a first conductive layer, a photoresist film, and a second conductive layer. Further, the method of manufacturing a semiconductor device includes the steps of (b) forming a protective film comprised of iodine on the surface of the second conductive layer, (c) removing the photoresist film, (d) removing a part of the first conductive layer, (e) irradiating the protective film with argon ions and removing the protective film, and (f) bringing a part of a bonding wire into contact with the surface of the second conductive layer.

According to an embodiment, the reliability of a semiconductor device can improve.

DETAILED DESCRIPTION

In the following embodiments, if necessary for convenience sake, each of the embodiments is explained by dividing it into multiple sections or embodiments but, unless otherwise specified, they are not unrelated to each other and are in the relationship of one being a modified example, a detail, a supplemental explanation, or the like of a part or the whole of another.

Further in the following embodiments, when the number of elements and others (including the number of pieces, a numerical value, a quantity, a range, and others) are referred to, except the cases of being specified and being limited obviously to a specific number in principle and other cases, the number is not limited to a specific number and may be larger or smaller than the specific number.

Furthermore in the following embodiments, it goes without saying that the constituent components (including a component step and others) are not necessarily essential except the cases of being specified and being obviously thought to be essential in principle and other cases.

Likewise in the following embodiments, when a shape, a positional relationship, and the like of a constituent component or the like are referred to, they substantially include those approximate or similar to the shape and the like except the cases of being specified and being obviously thought to be otherwise in principle and other cases. The same goes for a numerical value and a range.

Moreover, in all the drawings for explaining the embodiments, an identical member is represented with an identical code in principle and is not explained repeatedly. Here, hatching may sometimes be applied even in a plan view in order to make a drawing easy to understand.

Embodiment

<Semiconductor Device>

The present embodiment is explained on the basis of a QFP (Quad Flat Package) type semiconductor device.

Figure 1:
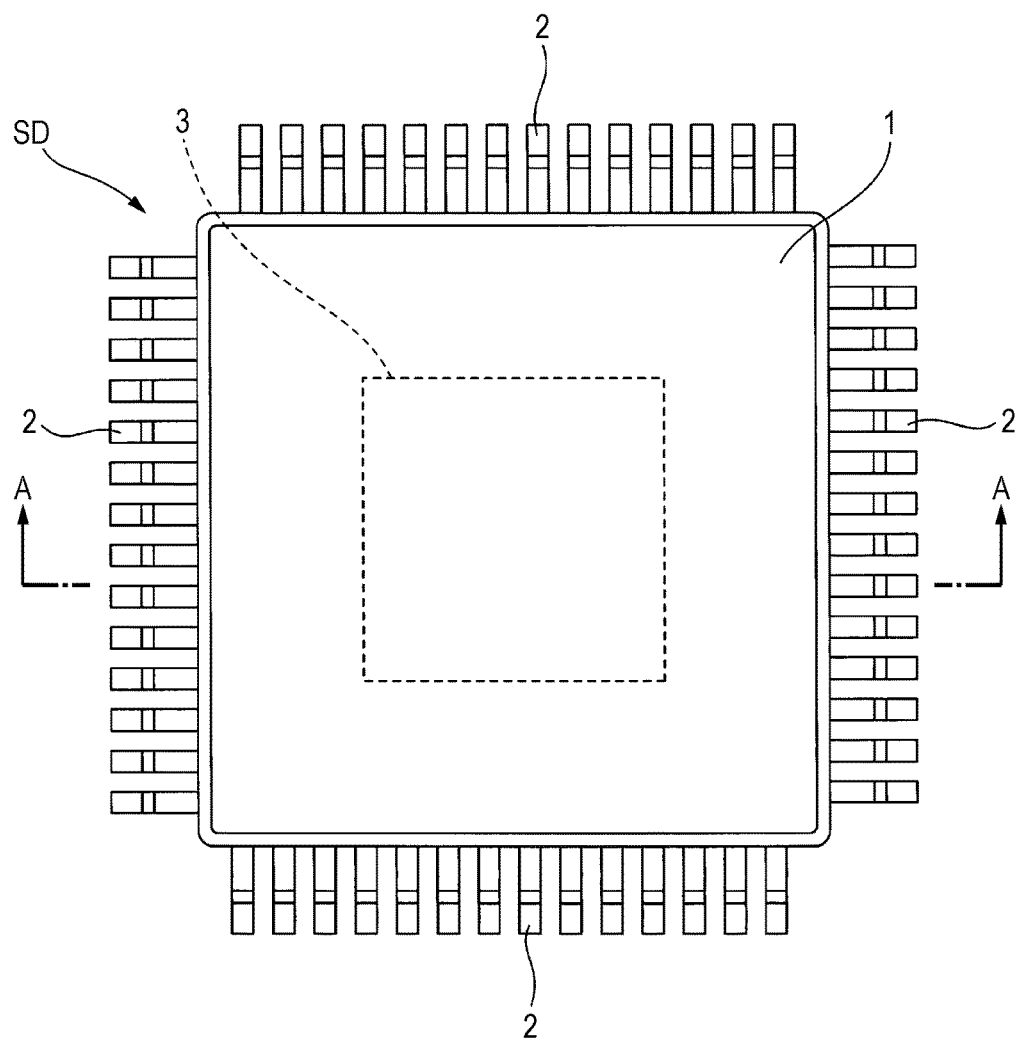
FIG. 1 is a plan view of a semiconductor device according to the present embodiment.
Figure 2:
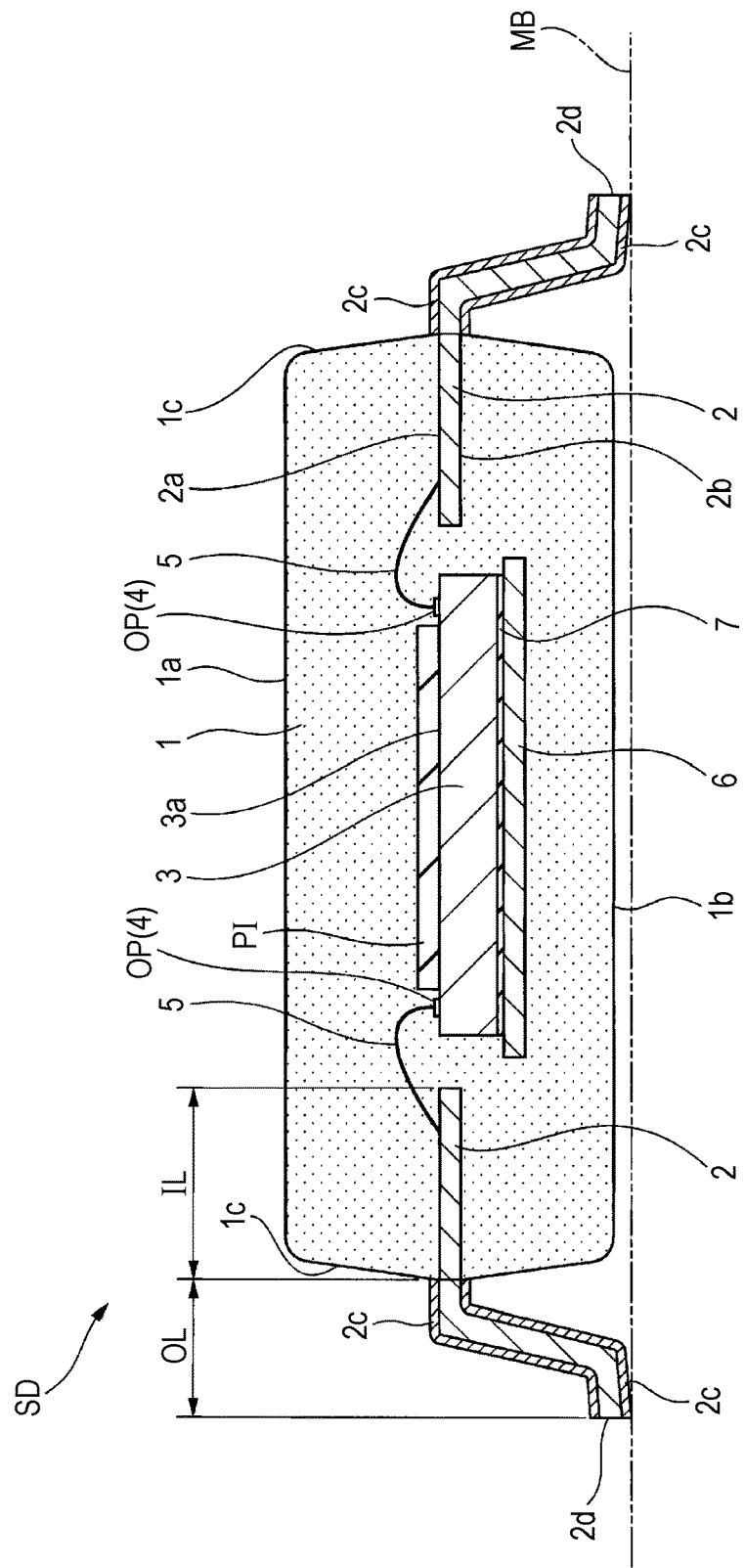
FIG. 2 is a sectional view taken on line A-A in FIG. 1.
Figure 3:
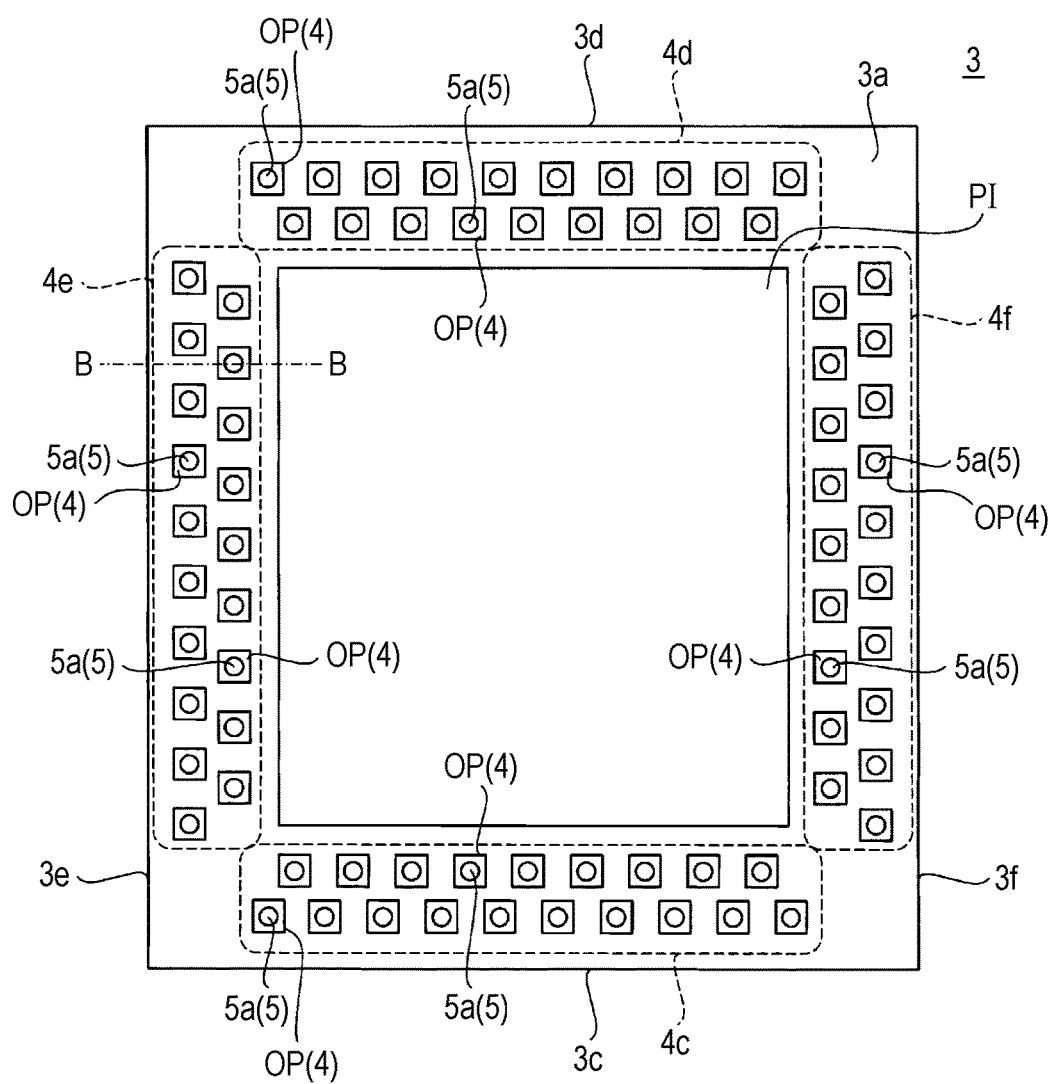
FIG. 3 is a plan view of a semiconductor chip according to the present embodiment.
Figure 4:
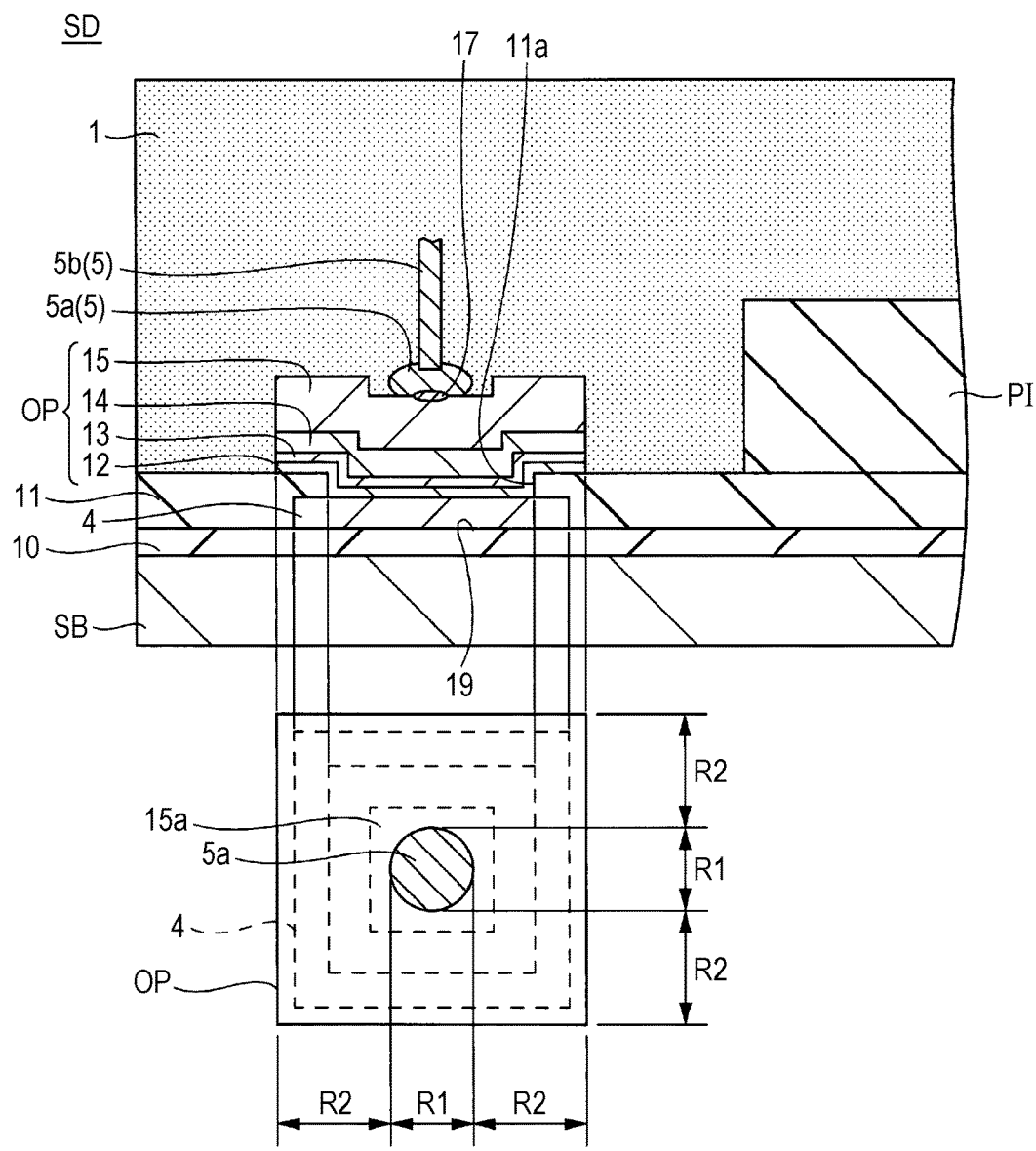
FIG. 4 is a sectional view of a substantial part taken on line B-B in FIG. 3.

Firstly, the configuration of a semiconductor device (semiconductor integrated circuit device) SD according to the present embodiment is explained in reference to FIGS. 1 to 4. FIG. 1 is a plan view of a semiconductor device SD according to the present embodiment. FIG. 2 is a sectional view taken on line A-A in FIG. 1. FIG. 3 is a plan view of a semiconductor chip 3 according to the present embodiment. FIG. 4 is a sectional view of a substantial part taken on line B-B in FIG. 3.

As shown in FIGS. 1 and 2, the semiconductor device SD according to the present embodiment has a semiconductor chip 3, a plurality of bonding wires 5, a plurality of leads 2, and a sealing body 1. The sealing body 1 has a nearly square planar-shape having four sides and the multiple leads 2 protrude from the sealing body 1 at the sides so as to extend in the directions perpendicular to the relevant sides. The semiconductor chip 3 is arranged at the center part of the sealing body 1. The semiconductor device SD is a QFP type semiconductor device.

The semiconductor chip 3 comprises a semiconductor substrate and has a plurality of semiconductor elements, a plurality of wires, a plurality of pad electrodes 4 (terminals, external electrodes, and external extraction pad electrodes), and a conductive layer OP. The semiconductor substrate configuring the semiconductor chip 3 comprises silicon (Si), for example.

The semiconductor elements are connected with the wires (metal wires) and configure a circuit block and the circuit block (semiconductor elements) is electrically connected with the pad electrodes 4 through the wires. Then the pad electrodes 4 are electrically connected with the leads 2 through the conductive layer OP and the bonding wires 5. The pad electrodes 4 are connected with the leads 2 by the bonding wires 5 through the conductive layer OP. The leads 2 are mainly composed of copper (Cu), for example. Further, the bonding wires 5 are mainly composed of copper (Cu), for example. Each of the bonding wires 5 has a ball part 5a and a wire part 5b as shown in FIG. 4 described later. As shown in FIG. 4, a ball part 5a is formed at an end of a wire part 5b, the ball part 5a is connected with a pad electrode 4 through the conductive layer OP, and the other end of the wire part 5b is connected to a lead 2.

Here, "comprise copper (Cu)" means a metal mainly composed of copper (Cu). Then a metal film, a lead, or a wire that is mainly composed of copper (Cu) means that it includes a copper alloy containing a trifle amount (1% or less) of metal additives. As metal additives, for example, aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), nickel (Ni), platinum (Pt), a lanthanoid series metal, and an actinoid series metal are named. Further, as a metal additive, a substance containing at least one kind of the above metals may also be adopted. Here, as a bonding wire 5, a wire mainly composed of gold (Au) may also be used.

The sealing body 1 covers the semiconductor chip 3, a polyimide layer PI, the conductive layer OP, the bonding wires 5, the leads 2, a die pad (chip mounting part) 6, and a bonding layer 7. The semiconductor chip 3 is bonded to the die pad 6 by the bonding layer 7. The sealing body 1 has a planar main surface (sealing body main surface) 1a, a planar back surface (sealing body back surface) 1b, and a side surface (sealing body side surface) 1c connecting the main surface 1a and the back surface 1b. The sealing body 1 comprises an epoxy resin, for example.

In FIG. 2, the long dashed double-short dashed line represents a mounting plane MB of a mounting substrate on which the semiconductor device SD is mounted. The main surface (upper surface, top surface) 1a and the back surface (lower surface) 1b are parallel with the mounting plane MB in the state of mounting the semiconductor device SD on the mounting substrate. Here, the surface on the side closer to the mounting plane MB is called as a sealing body back surface (lower surface) 1b and the surface on the farther side is called as a sealing body main surface (upper surface, top surface) 1a in the state of mounting the semiconductor device SD on the mounting substrate. The leads 2 are arranged so as to surround the semiconductor chip 3 and extend radially from the semiconductor chip 3. Each of the leads 2 has a main surface (upper surface, top surface, lead main surface) 2a and a back surface (lower surface, lead back surface) 2b. Each of the leads 2 comprises an inner lead part IL and an outer lead part OL and the inner lead part IL is located in the interior of the sealing body 1. The main surface 2a and the back surface 2b of each of the outer lead parts OL are covered with a solder plating film 2C, The side surfaces of the leads 2 of the outer lead parts OL are also covered with the solder plating film 2C but the tips 2d of the outer leads OL are not covered with the solder plating film 2c and the base material is exposed partially. The circumference of the base material at the tips 2d, however, is covered with the solder plating film 2c. Each of the bonding wires 5 is connected with the main surface 2a of the inner lead part IL of each of the leads 2.

Further, each of the outer lead parts OL: has a gull-wing shape; and has a protruding part protruding continuously and linearly from each of the inner lead parts IL to the exterior of the sealing body 1, a bent part extending from the protruding part toward the mounting plane MB, and a connecting part extending from the bent part nearly parallel with the mounting plane MB and being connected with the mounting substrate through mounting solder.

As shown in FIG. 3, the semiconductor chip 3 of a rectangular shape in a plan view has a side 3c and a side 3d facing to each other and a side 3e and a side 3f facing to each other. On the main surface 3a of the semiconductor chip 3, pad electrode groups 4c to 4f each of which is an aggregate of multiple pad electrodes 4 are formed along the sides 3c to 3f.

In the pad electrode group 4c: a plurality of pad electrodes 4 are arranged in two lows along the side 3c; the conductive layer OP is arranged on each of the pad electrodes 4; and a ball part 5a of each of the bonding wires 5 is connected with the conductive layer OP. The pad electrode groups 4d, 4e, and 4f have similar configurations.

The polyimide layer (organic insulating film) PI of a rectangular shape in a plan view is formed on the main surface 3a of the semiconductor chip 3 in a region surrounded by the four pad electrode groups 4c to 4f. The polyimide layer PI is formed in the region surrounded by the pad electrode groups 4c to 4f but is not formed at corners (for example, a region between the pad electrode group 4c and the pad electrode group 4e or 4f, or a region between the pad electrode group 4d and the pad electrode group 4e or 4f) and in a region between the pad electrode groups 4c to 4f and the sides 3c to 3f in the semiconductor chip 3, Further, the polyimide layer PI is not formed also in a region among the pad electrodes 4 in the pad electrode groups 4c to 4f. That is, as shown in FIGS. 3 and 4, the sealing body 1 touches an insulating film 11 in a region where the pad electrodes 4 (and the conductive layer OP) are not formed between the polyimide layer PI and the sides 3c to 3f.

Semiconductor elements formed in the semiconductor chip 3: include a MISFET (Metal Insulator Semiconductor Field Effect Transistor) and a non-volatile memory cell, for example; and are formed in the semiconductor substrate SIB (refer to FIG. 4) in the region covered with the polyimide layer PI in FIG. 3, for example.

FIG. 4 is a sectional view taken on line B-B in FIG. 3. Here, a plan view of a pad electrode 4 and a conductive layer OP is also shown at the lower part of FIG. 4.

As shown in FIG. 4, a pad electrode 4 is arranged over a semiconductor substrate SB via an insulating film 10 having a high relative dielectric constant. The insulating film 10 of a high mechanical strength comprises an inorganic insulating film such as a silicon oxide film, for example. The pad electrode 4 comprises aluminum (Al) but may take: a laminated structure formed by arranging a titanium film/titanium nitride film or the like under a film comprising aluminum; or a laminated structure formed by further arranging a titanium nitride film as an upper layer. Furthermore, a trifle amount (for example, 2 wt % or less) of copper or the like may be added to an aluminum film configuring the pad electrode 4.

The pad electrode 4 and the insulating film 10 are covered with an insulating film 11 functioning as a protective film and an opening to expose a part of the main surface of the pad electrode 4 is formed in the insulating film 11. Further, the insulating film 11 comprises: an inorganic insulating film such as a silicon oxide film, a silicon nitride film, or a laminated film obtained by forming a silicon nitride film on a silicon oxide film; or an organic insulating film such as a polyimide film, a laminated film obtained by forming a silicon oxide film on a polyimide film, or a laminated film obtained by forming a silicon nitride film on a polyimide film.

A conductive layer OP is formed on the pad electrode 4 and a bonding wire 5 is electrically connected with the pad electrode 4 through the conductive layer OP. The conductive layer OP touches the pad electrode 4 at the opening formed in the insulating film 11 and extends on the insulating film 11.

Here, when a titanium nitride film is formed over an aluminum film configuring the pad electrode 4, at the opening, the titanium nitride film that has a resistance higher than the aluminum film is removed and the main surface of the aluminum film is exposed. That is, the conductive layer OP touches the aluminum film configuring the pad electrode 4 without the titanium nitride film interposed.

The conductive layer OP comprises four conductive layers 12, 13, 14, and 15 in this order from the side of the pad electrode 4. The conductive layer 12 comprises titanium (Ti), for example, the conductive layer 13 comprises copper (Cu), for example, the conductive layer 14 comprises nickel (Ni), for example, and the conductive layer 15 comprises gold (Au), for example.

The conductive layer 12 is a reaction preventing layer (barrier metal layer) between the pad electrode 4 and the conductive layer 13 and the conductive layer 13 is a feed layer (seed layer) when the conductive layers 14 and 15 are formed by an electrolytic plating method. Further, the conductive layer 14: is a stress relieving layer for preventing the pad electrode 4 from deforming by a stress during wire bonding; and also functions as a reaction preventing layer to prevent copper configuring the conductive layer 13 from diffusing into the conductive layer 15 and moreover as a feed layer when the conductive layer 15 is formed by an electrolytic plating method. Furthermore, the conductive layer 15 is a bonding layer for forming an alloy layer with the bonding wire 5. Consequently, the surface (upper surface) of the conductive layer 15 comes to be a wire bonding plane. Here, as the conductive layer 12, chromium (Cr) can be used other than titanium. Further, as the conductive layer 15, palladium (Pd) can be used other than gold.

Further, although the present embodiment has been explained on the basis of the case where the conductive layer 12 is formed as a reaction preventing layer between the pad electrode 4 and the conductive layer 15, the conductive layer 12 may not be formed. In order to prevent copper configuring the conductive layer 13 from diffusing into the pad electrode 4 however, it is desirable to form the conductive layer 13 on the pad electrode 4 via the conductive layer 12 like the present embodiment.

As shown in FIG. 4, in the present embodiment, the conductive layers 12, 13, 14, and 15: are formed into a rectangular shape of a nearly identical size in a plan view; and overlap with each other in the thickness direction at an identical position. Further, as shown in FIG. 4, the conductive layer OP is formed so as to: be larger than the pad electrode 4; and overlap with the pad electrode 4 in the thickness direction. Here, the conductive layer OP may have a size identical to the pad electrode 4 or a size smaller than the pad electrode 4. The pad electrode 4 and the conductive layer OP, however, are preferably larger than the opening formed in the insulating film 11. Further, as it will be described later as a modified example, the conductive layer OP may be formed so as not to overlap with the pad electrode 4 in the thickness direction.

As shown in FIG. 4, in a plan view, a junction of a ball part 5a of the bonding wire 5 and the conductive layer 15 is represented as a first region R1 and the main surface of the conductive layer 15 other than the first region R1 is represented as a second region R2. That is, the first region R1 is the center part of the conductive layer 15 and the second region R2 surrounds the first region R1 continuously. Further, a recess 15a is formed in the center of the main surface (upper surface) of the conductive layer 15 and the ball part 5a of the bonding wire 5 is formed inside the recess 15a, for example. Meanwhile, the conductive layer 15 comprised of gold has a low hardness and hence the ball part 5a may be arranged in the manner of straddling the recess 15a and a protrusion surrounding the recess 15a. The conductive layer 14, however, has a hardness higher than the conductive layer 15 and hence the ball part 5a is preferably arranged inside the recess of the conductive layer 14.

As shown in FIG. 4, a polyimide layer PI is formed on the insulating film 11 in the manner of touching the insulating film 11 and the polyimide layer PI, the conductive layer OP, the bonding wire 5, and the insulating film 11 are covered with a sealing body 1. The sealing body 1 comprises an epoxy resin and contains a silane coupling agent, for example.

As shown in FIG. 4, an alloy layer 17 comprised of gold and copper is formed between the conductive layer 15 and the ball part 5a of the bonding wire 5. That is, the alloy layer 17 is formed in the first region R1 in FIG. 4.

<Method of Manufacturing Semiconductor Device>

Figure 5:
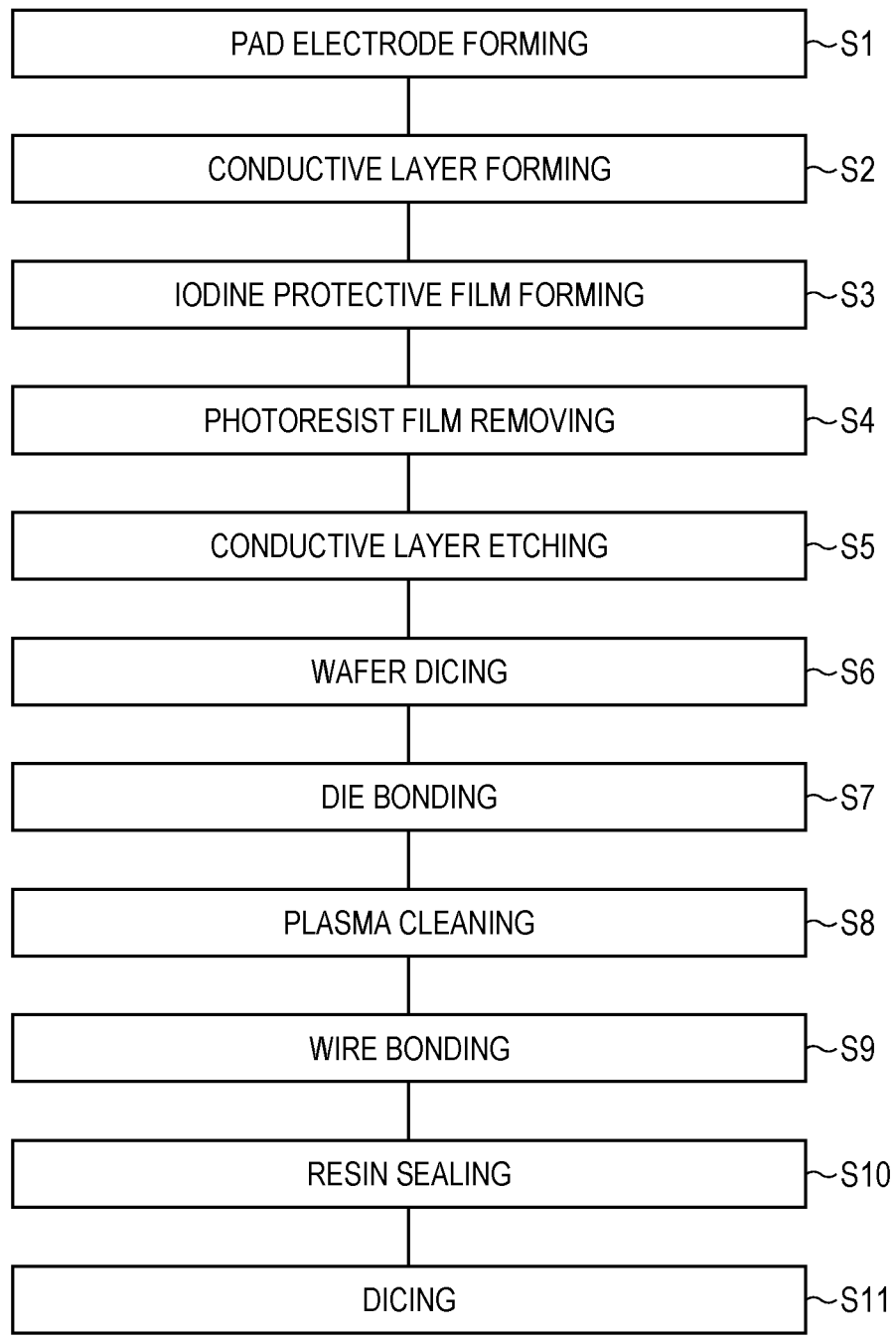
FIG. 5 is a process flow chart showing manufacturing steps of a semiconductor device according to the present embodiment.
Figure 6:
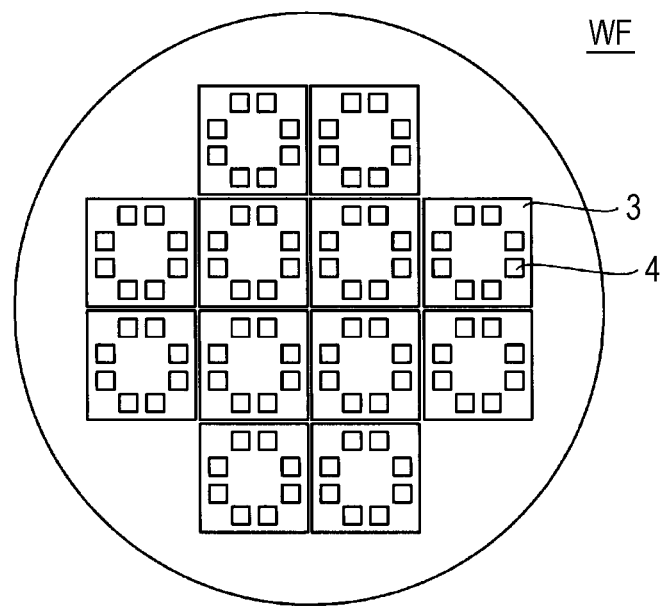
FIG. 6 is a plan view of semiconductor devices during a manufacturing step according to the present embodiment.
Figure 7:
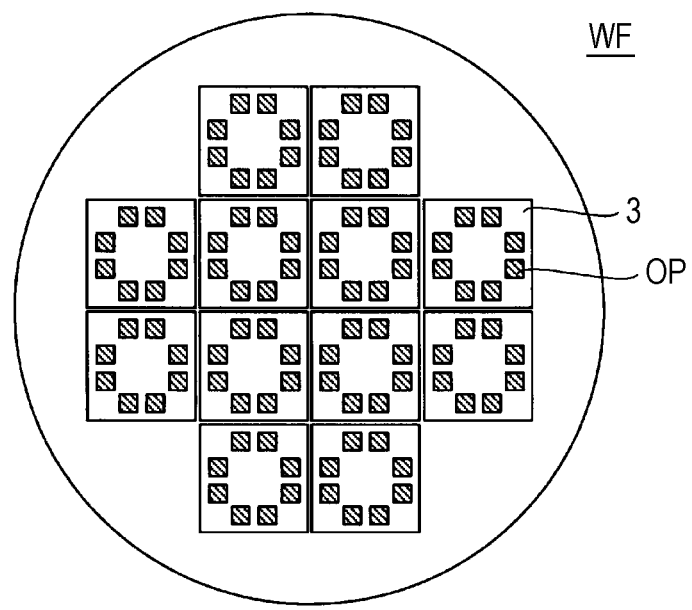
FIG. 7 is a plan view of the semiconductor devices during a manufacturing step subsequent to FIG. 6.
Figure 17:
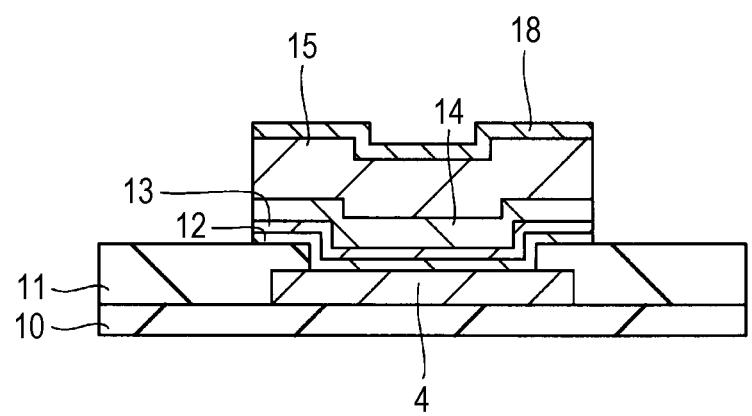
FIG. 17 is a sectional view of the semiconductor device during a manufacturing step subsequent to FIG. 16.
Figure 18:
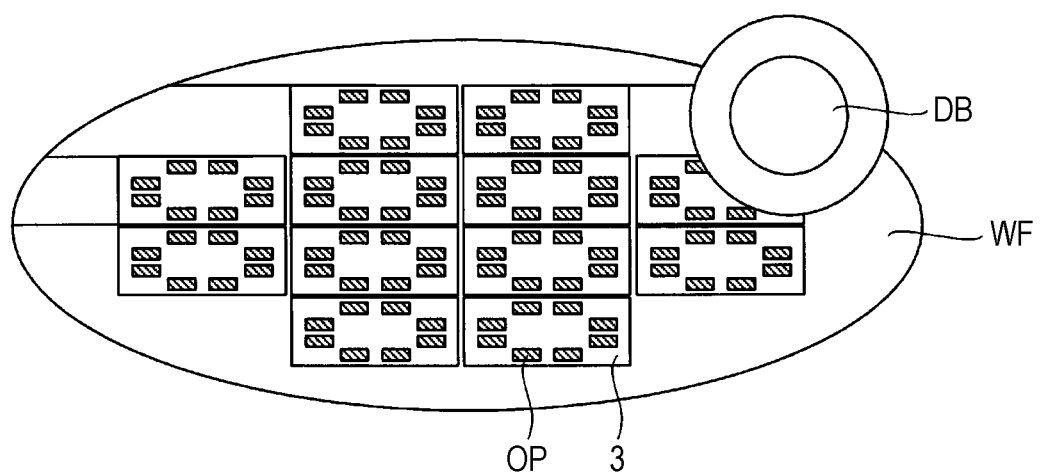
FIG. 18 is a perspective view of semiconductor devices during a manufacturing step subsequent to FIG. 17.

Successively, a method of manufacturing a semiconductor device SD according to the present embodiment is explained in reference to FIGS. 5 to 23. FIG. 5 is a process flow chart showing manufacturing steps of a semiconductor device according to the present embodiment. FIGS. 6 and 7 are plan views of semiconductor devices during manufacturing steps according to the present embodiment. FIGS. 8 to 17 and 19 to 23 are sectional views of a semiconductor device during the manufacturing steps according to the present embodiment. FIG. 18 is a perspective view of semiconductor devices during a manufacturing step according to the present embodiment.

In the present embodiment, the process is explained by being classified roughly into the six steps of a provision step of a semiconductor wafer (S1 to S5), a die bonding step (S6 and S7), a plasma cleaning step (S8), a wire bonding step (S9), a resin sealing step (S10), and a dicing step (S11).

1. Provision Step of Semiconductor Wafer

In the present embodiment, a semiconductor wafer WF formed by applying OPM (Over Pad Metallization) on the surface of a pad electrode 4 is provided through the following steps.

Firstly, a pad electrode forming step (S1) shown in FIG. 5 is applied. Concretely, an insulating film 10 comprised of an inorganic insulating film, such as a silicon oxide film having a high mechanical strength is formed over a semiconductor substrate SB. Successively, pad electrodes 4 are formed of aluminum that is a conductive member (conductive material) on a first surface of the insulating film 10. The pad electrodes 4 are formed by a sputtering method, for example. As a result, as shown in FIG. 6, a semiconductor wafer WF in which a plurality of semiconductor chips 3 having the pad electrodes 4 are arranged in a matrix is formed.

Here, the first surface: is the surface of the semiconductor substrate SB or the surface of the insulating film 10 formed on the semiconductor substrate SB; and means a pad electrode forming surface 19 on which pad electrodes are formed. In the present embodiment, since pad electrodes 4 are formed on the surface of the insulating film 10, the surface of the insulating film 10 is the pad electrode forming surface 19. Here, in FIGS. 6 and 7, semiconductor chips 3 are represented in a simplified manner and hence, for example, the numbers of the pad electrodes 4 and the conductive layers OP are different from those in FIG. 3. The above procedures are the pad electrode forming step (S1).

Successively, through a conductive layer forming step (S2), an iodine protective film forming step (S3), a photoresist film removing step (S4), and a conductive layer etching step (S5) shown in FIG. 5, as shown in FIG. 7, a conductive layer OP is formed on the pad electrodes 4 in the semiconductor chips 3. A method for forming the conductive layer OP is explained hereunder in reference to FIG. 5 and FIGS. 8 to 17.

Firstly, the conductive layer forming step (S2) shown in FIG. 5 is applied. The conductive layer forming step (S2) is a step of forming an insulating film 11 and conductive layers 12, 13, 14, and 15 on a pad electrode 4.

Figure 8:
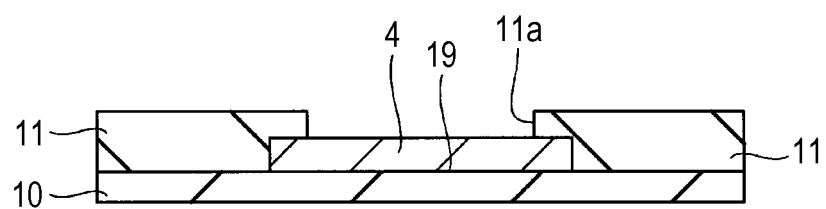
FIG. 8 is a sectional view of a semiconductor device during the manufacturing step shown in FIG. 7.

Concretely, as shown in FIG. 8, an insulating film 11 is formed of a silicon oxide that is an insulating member on the pad electrode forming surface 19 so that the insulating film 10 and the pad electrode 4 may be covered but an opening 11a to expose a part of the surface of the pad electrode 4 may be formed. The insulating film 11 is formed by a CVD (Chemical Vapor Deposition) method, for example. Here, the insulating film 11 may comprise, besides a silicon oxide film: an inorganic insulating film such as a silicon nitride film or a laminated film obtained by forming a silicon nitride film on a silicon oxide film; or an organic insulating film such as a polyimide film, a laminated film obtained by forming a silicon oxide film on a polyimide film, or a laminated film obtained by forming a silicon nitride film on a polyimide film.

Further, a part of the insulating film 11 corresponding to the opening 11a may be removed by a wet etching method after the insulating film 11 is formed on the whole pad electrode forming surface 19. Here, in such a forming method, a part (surface) of the pad electrode 4 is over-etched in some cases depending on an etching condition (for example, time) and in such a case the opening 11a exposes not only the surface of the pad electrode but also a part of the interior.

Figure 9:
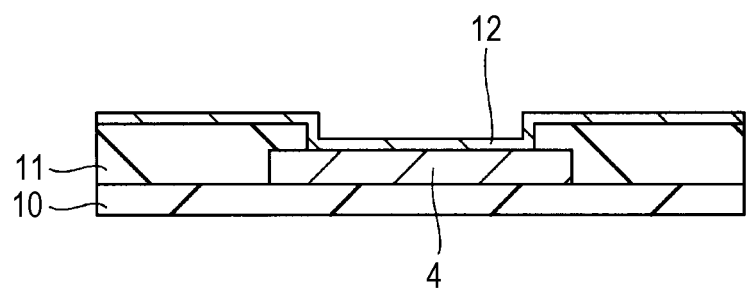
FIG. 9 is a sectional view of the semiconductor device during a manufacturing step subsequent to FIG. 8.

Successively, as shown in FIG. 9, a conductive layer 12 comprised of titanium is formed on the surface of the insulating film 11 so as to touch and cover the pad electrode 4 exposed from the opening 11a of the insulating film 11.

Figure 10:
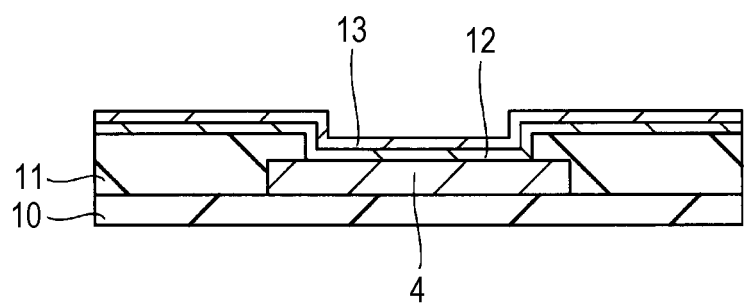
FIG. 10 is a sectional view of the semiconductor device during a manufacturing step subsequent to FIG. 9.

Successively, as shown in FIG. 10, a conductive layer 13 comprised of copper is formed on the surface of the conductive layer 12 and electrically connected with the pad electrode 4 through the conductive layer 12. The conductive layers 12 and 13 are formed by a sputtering method, for example. As stated earlier, the conductive layer 12 is a reaction preventing layer between the pad electrode 4 and the conductive layer 13 and the conductive layer 13 is a feed layer when conductive layers 14 and 15 are formed by an electrolytic plating method.

Figure 11:
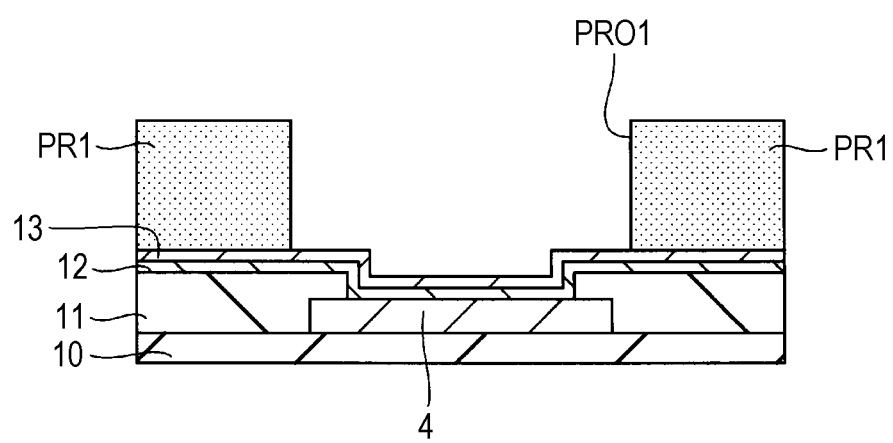
FIG. 11 is a sectional view of the semiconductor device during a manufacturing step subsequent to FIG. 10.

Successively, as shown in FIG. 11, a photoresist film PR1 having an opening PRO1 is formed on the conductive layer 13. The photoresist film PR1 is a film for forming the conductive layers 14 and 15 that will be described later selectively in regions (regions R1 and R2 where the conductive layer OP shown in FIG. 4 is formed) overlapping with the pad electrode 4 in the thickness direction. Concretely, the photoresist film PR1 is formed on the surface of the conductive layer 13 and successively the opening PRO1 is formed by removing the parts corresponding to the regions R1 and R2 where the conductive layer OP is formed. As a result, conductive layer OP forming regions R1 and R2 are exposed. Here, the photoresist film PR1 comprises an organic insulating film mainly composed of carbon.

Figure 12:
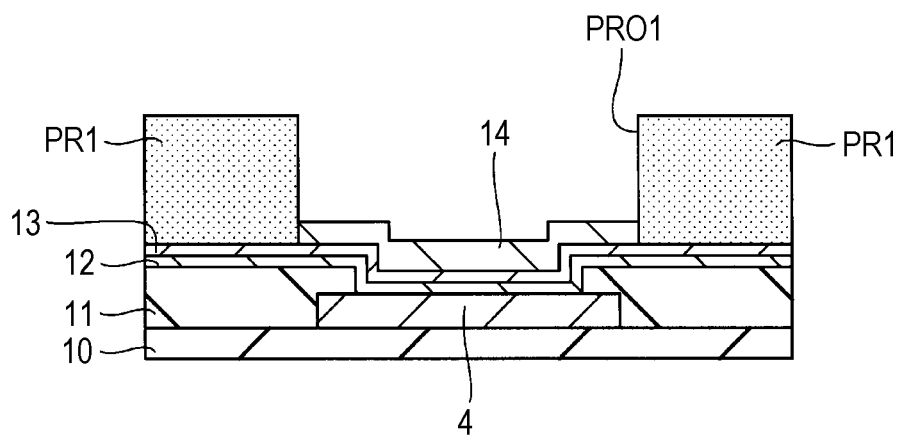
FIG. 12 is a sectional view of the semiconductor device during a manufacturing step subsequent to FIG. 11.

Successively, as shown in FIG. 12, a conductive layer 14 comprised of nickel that is a conductive material is formed selectively on the conductive layer 13 in the opening PRO1 by an electrolytic plating method. Here, the thickness of the conductive layer 14 is 1.5 to 2.0 µm, for example. The conductive layer 14 is a stress relieving layer to prevent the pad electrode 4 from deforming by a stress during wire bonding at the wire bonding step (S9) and the thickness of the conductive layer 14 is a thickness that is sufficient for alleviating an impact received by the pad electrode 4. Further, as stated earlier, the conductive layer 14: is a stress relieving layer to prevent the pad electrode 4 from deforming by a stress during wire bonding; and also functions as a reaction preventing layer to prevent copper configuring the conductive layer 13 from diffusing into a conductive layer 15 and moreover as a feed layer when the conductive layer 15 is formed by an electrolytic plating method.

Figure 13:
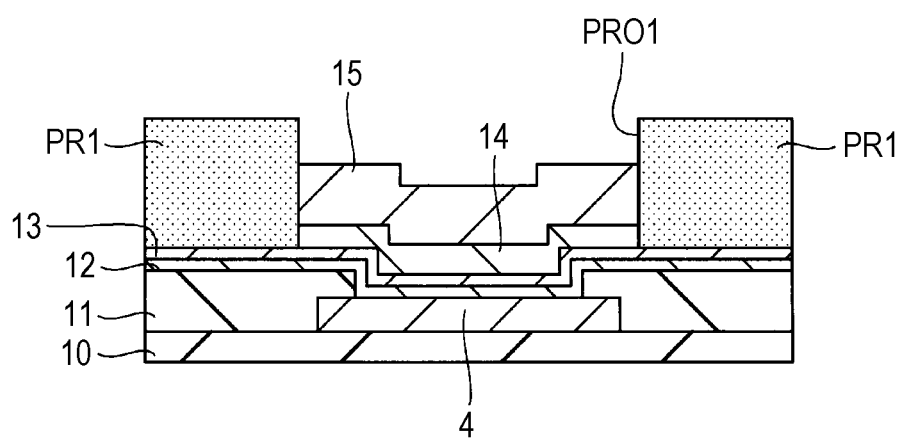
FIG. 13 is a sectional view of the semiconductor device during a manufacturing step subsequent to FIG. 12.

Successively, as shown in FIG. 13, a conductive layer 15 comprised of gold that is a conductive material is formed selectively on the conductive layer 14 in the opening PRO1 by an electrolytic plating method. Here, the thickness of the conductive layer 15 is set at not less than 1.5 µm or preferably not less than 1.5 to less than 2.0 µm. As stated earlier, the conductive layer 15 is a bonding layer for forming an alloy layer 17 (refer to FIG. 4) between the conductive layer OP and a bonding wire 5 and the surface (upper surface) of the conductive layer 15 is a wire bonding plane. The above procedures are the conductive layer forming step (S2).

Figure 14:
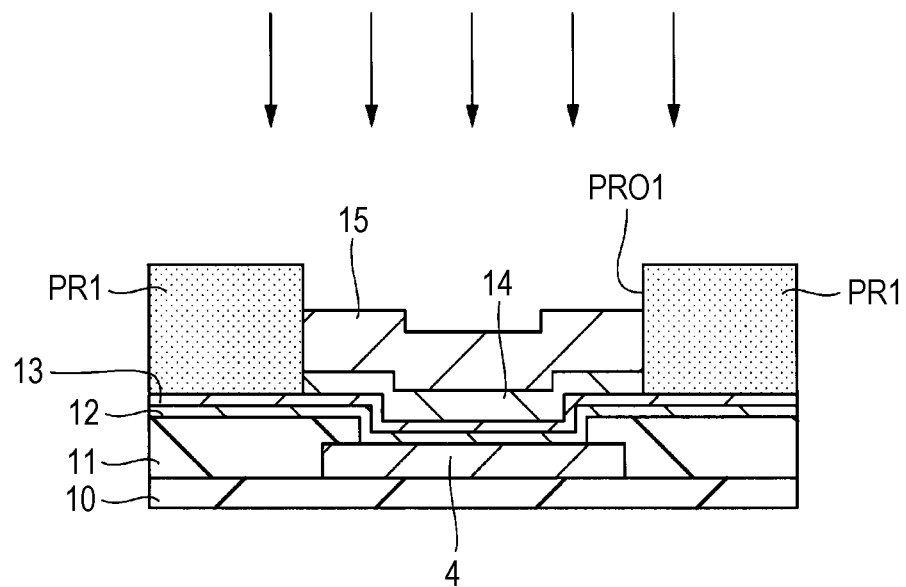
FIG. 14 is a sectional view of the semiconductor device during a manufacturing step subsequent to FIG. 13.

Successively, the iodine protective film forming step (S3) shown in FIG. 5 is applied. At the iodine protective film forming step (S3), as shown in FIG. 14, a protective film 18 comprised of iodine is formed on the surface of the conductive layer 15 by exposing the semiconductor wafer WF in an iodine atmosphere (refer to FIG. 15). As it will be described later, the protective film 18 is preferably formed as a monolayer adsorption film on the surface of the conductive layer 15. The forming conditions of the protective film 18 on this occasion are that the partial pressure of an iodine gas is about 100 Pa and the exposure time is 600 seconds.

Figure 16:
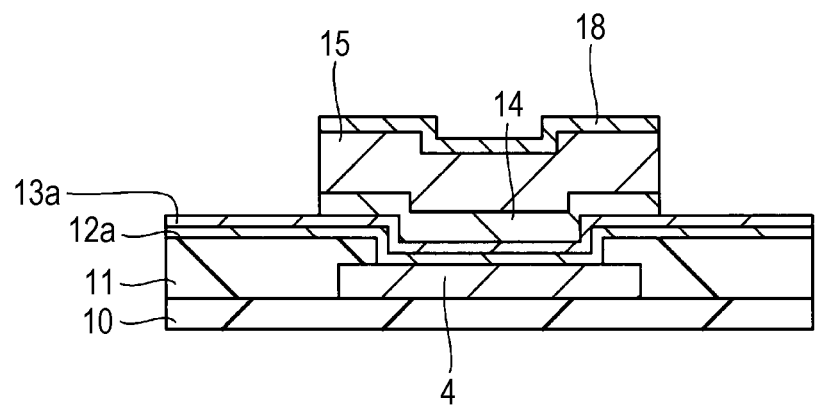
FIG. 16 is a sectional view of the semiconductor device during a manufacturing step subsequent to FIG. 15.

Successively, the photoresist film removing step (S4) shown in FIG. 5 is applied. At the photoresist film removing step (S4), as shown in FIG. 16, the photoresist film PR1 is removed by a wet etching method using an etching liquid. As an example of the etching liquid, an organic solvent obtained by mixing alkyl benzene sulfonic acid as an organic acid is used. Here, although an etching liquid that allows only the photoresist film PR1 to be removed selectively, namely does not remove the conductive layer 13 covered with the photoresist film PR1, is selected at the present step, a part (surface) of the conductive layer 13 covered with the photoresist film PR1 may sometimes be over-etched depending on an etching condition (for example, time).

Successively, the conductive layer etching step (S5) shown in FIG. 5 is applied. At the conductive layer etching step (S5), as shown in FIG. 17, the conductive layers 12*a* and 13*a* in the region exposed from the conductive layers 14 and 15 are removed by a wet etching method using an etching liquid. As an example of the etching liquid, a liquid obtained by mixing sulfuric acid and a hydrogen peroxide solution at a concentration ratio by weight of 10 to 1 is used. The etching time is about 4 minutes.

In this way, the conductive layer OP of a laminated structure comprised of the conductive layers 12, 13, 14, and 15 is formed on the pad electrodes 4 of the semiconductor chips 3 as shown in FIGS. 4, 7, and 17 through the conductive layer forming step (S2), the iodine protective film forming step (S3), the photoresist film removing step (S4), and the conductive layer etching step (S5) shown in FIG. 5.

2. Die Bonding Step

Figure 19:
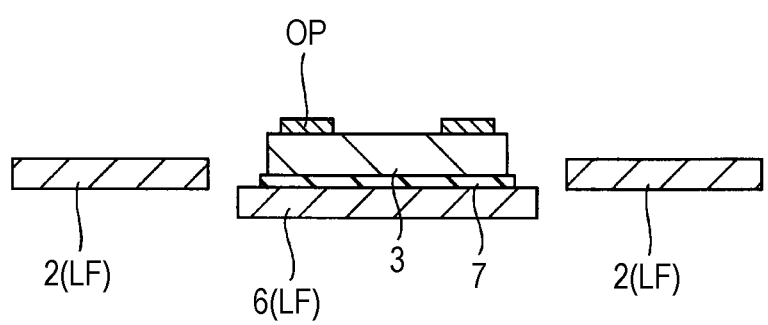
FIG. 19 is a sectional view of a semiconductor device during a manufacturing step subsequent to FIG. 18.

Successively, a semiconductor chip 3 is fixed (mounted) on a base material through a wafer dicing step (S6) and a die bonding step (S7) shown in FIG. 5. Here, in the present embodiment, a lead frame LF having leads 2 and a die pad 6 is used as the base material as shown in FIGS. 2 and 19.

Firstly, the wafer dicing step (S6) shown in FIG. 5 is applied. At the wafer dicing step (S6), as shown in FIG. 18, a semiconductor wafer WF is divided into a plurality of semiconductor chips 3 with a dicing blade DB. Although it is not shown in the figure, at the present step, the semiconductor wafer WF is cut with a dicing blade DB while cutting water is blown against the surface of the semiconductor wafer WF.

Successively, the die bonding step (S7) shown in FIG. 5 is applied. At the die bonding step (S7), as shown in FIG. 19, a diced semiconductor chip 3 is arranged (temporarily bonded) on a die pad 6 of a lead frame LF via a bonding layer (die bonding material) 7 comprised of a paste material containing a thermosetting resin. Then by applying heat treatment at a temperature of about 170° C to 180° C, the bonding layer 7 hardens and the semiconductor chip 3 is fixed (finally bonded) on the die pad 6. Here, a film material may also be used instead of a paste material. Further, although it is not shown in the figure, in a lead frame LF, a plurality of semiconductor device forming regions exist and a plurality of die pads 6 are mounted.

3. Plasma Cleaning Step

Figure 20:
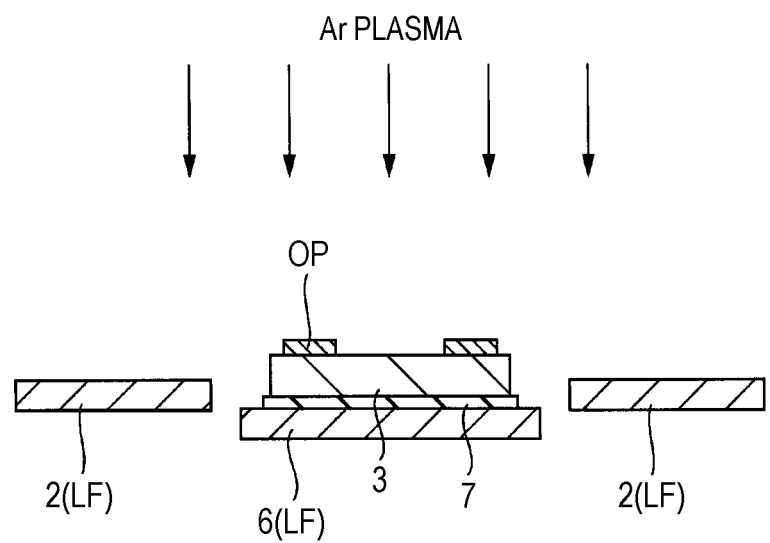
FIG. 20 is a sectional view of the semiconductor device during a manufacturing step subsequent to FIG. 19.
Figure 21:
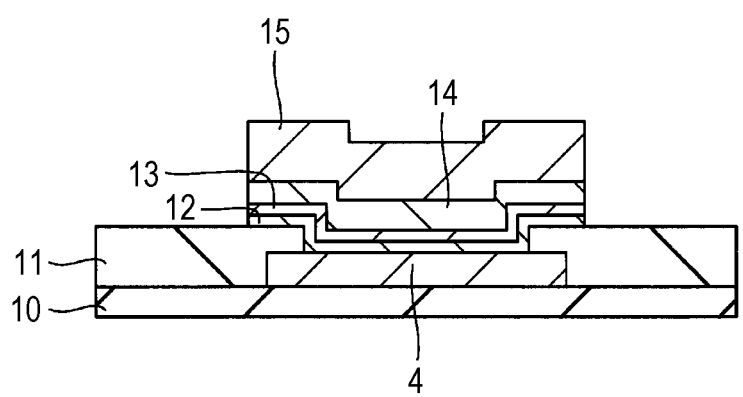
FIG. 21 is a sectional view of the semiconductor device during a manufacturing step subsequent to FIG. 20.

Successively, a plasma cleaning step (S8) shown in FIG. 5 is applied. At the plasma cleaning step (S8), as shown in FIG. 20, plasma cleaning using an argon (Ar) gas is applied to the semiconductor chip 3 fixed to the lead frame LF. The plasma cleaning is applied under the conditions of an argon gas partial pressure of about 15 Pa, an electric power of 200 W, and an irradiation time of 10 seconds. Through the step, the protective film 18 comprised of iodine formed on the surface of the outermost conductive layer 15 in the multiple conductive layers configuring the conductive layer OP is removed as shown in FIG. 21. That is, the surface of the conductive layer 15 that is the outermost layer of the conductive layer OP is cleaned. The details including the mechanism are described later.

4. Wire Bonding Step

Figure 22:
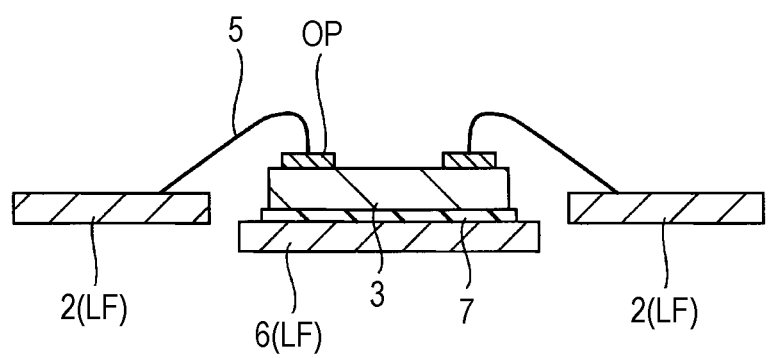
FIG. 22 is a sectional view of the semiconductor device during a manufacturing step subsequent to FIG. 21.

Successively, a wire bonding step (S9) shown in FIG. 5 is applied. At the wire bonding step (S9), as shown in FIG. 22, the conductive layer OP formed over the main surface of the semiconductor chip 3 and leads 2 are connected through bonding wires 5. The bonding wires 5 are connected with the conductive layer OP by a ball bonding (nail head bonding) method using thermo-compression bonding and ultrasonic vibration in combination. Concretely, after a part (ball part 5*a*) of a bonding wire 5 is connected with the surface of the conductive layer OP, the other part of the bonding wire 5 is connected with a wire junction of a lead 2 of the lead frame LF. Further, a bonding wire 5 used in the present embodiment is a wire mainly composed of copper. At the step, an alloy layer 17 (refer to FIG. 4) comprised of copper and gold is formed in the thickness of about several nanometers at the surface of the conductive layer OP with which the bonding wire 5 is connected. Here, as the bonding wire 5, a wire mainly composed of gold (Au) may also be used.

5. Resin Sealing Step

Figure 23:
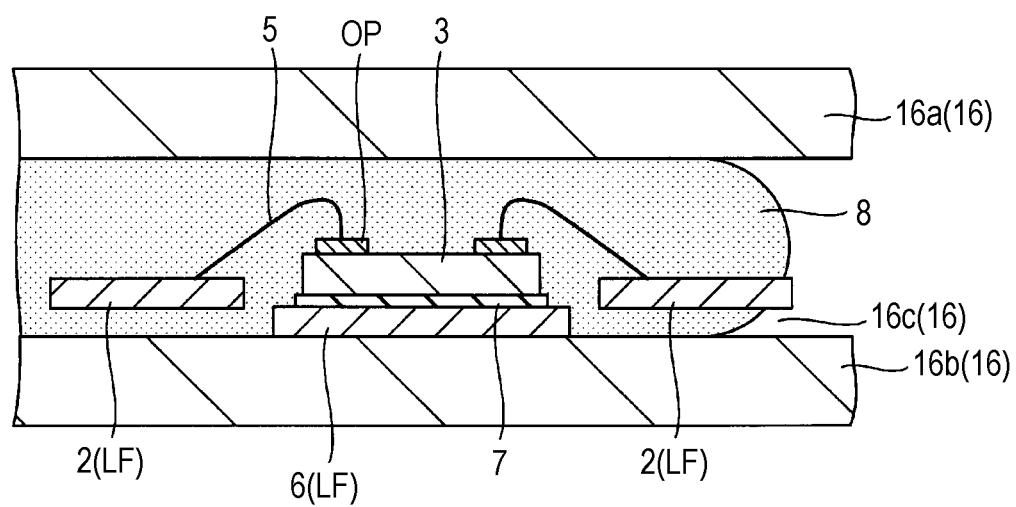
FIG. 23 is a sectional view of the semiconductor device during a manufacturing step subsequent to FIG. 22.

Successively, a resin sealing step (S10) shown in FIG. 5 is applied. In the present embodiment, a transfer mold method is used. At the resin sealing step (S10), as shown in FIG. 23, a sealing body 1 shown in FIG. 4 is formed by placing the semiconductor chip 3 and the led frame LF in a cavity 16c formed between the mating faces of an upper mold 16a and a lower mold 16b of a mold 16 and filling the cavity 16c with a sealing resin 8. Here, the sealing resin 8 comprises an epoxy resin containing a silicon coupling agent, for example. Further, a compression resin sealing method (a method of preparing molten resin in a cavity, immersing a semiconductor chip and a lead frame in the molten resin, and solidifying the resin) can also be used instead of the transfer mold method.

6. Dicing Step

Finally, a dicing step (S11) shown in FIG. 5 is applied. Although it is not shown in the figures, concretely, in a QFP type semiconductor device according to the present embodiment, a semiconductor device SD (refer to FIG. 2) having an inner lead part IL and an outer lead part OL is separated from a lead frame LF that is a base material by cutting leads 2 (or the lead frame LF) with a cutting die. Through the above steps, the semiconductor device SD is completed.

Meanwhile, a semiconductor device can also be separated by using a dicing blade DB like in the case of a BGA (Ball Grid Array) type semiconductor device that is a modified example described later.

<Problems Assumed at Steps, Features and Effects of Present Embodiment>

Figure 24:
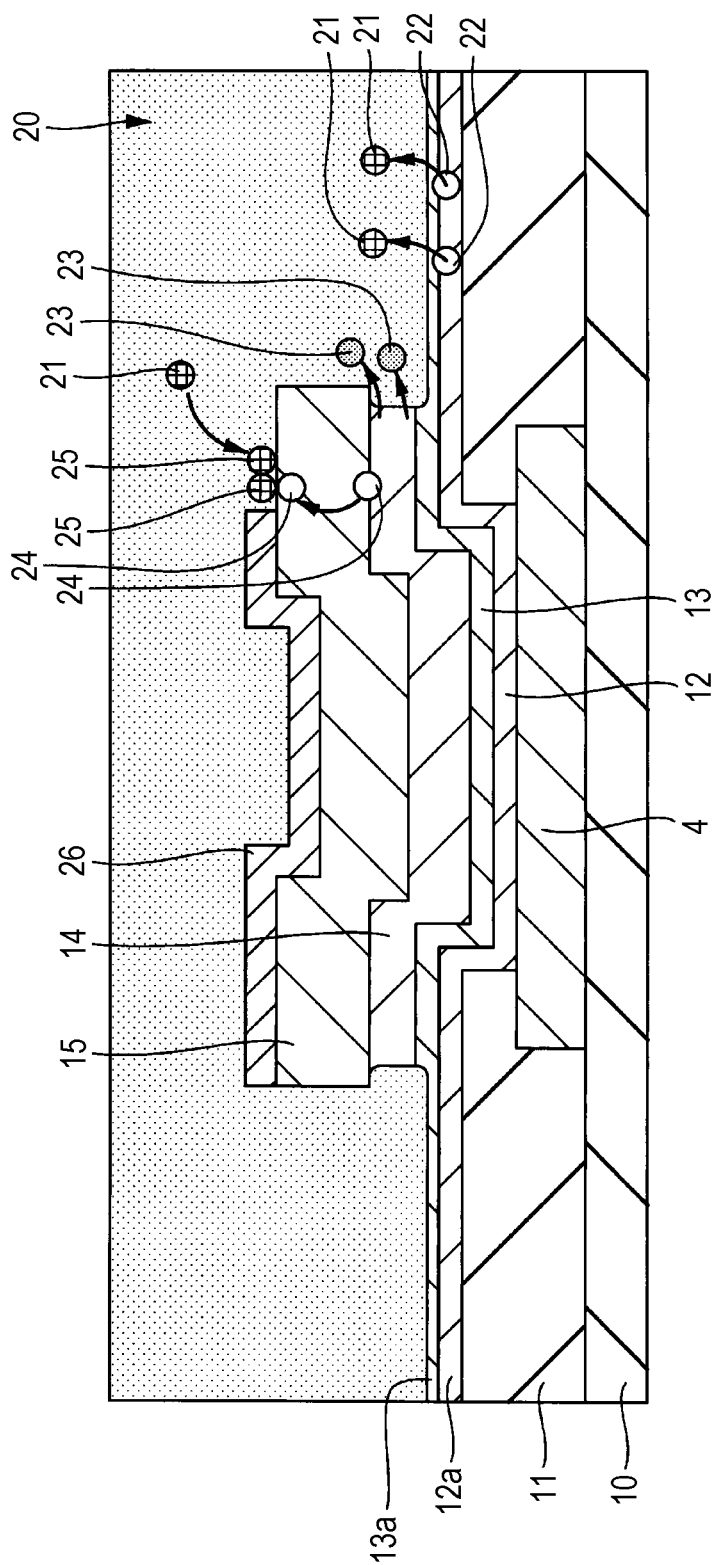
FIG. 24 is a conceptual diagram showing a reaction mechanism at a conductive layer surface at an etching step according to the present embodiment.
Figure 25:
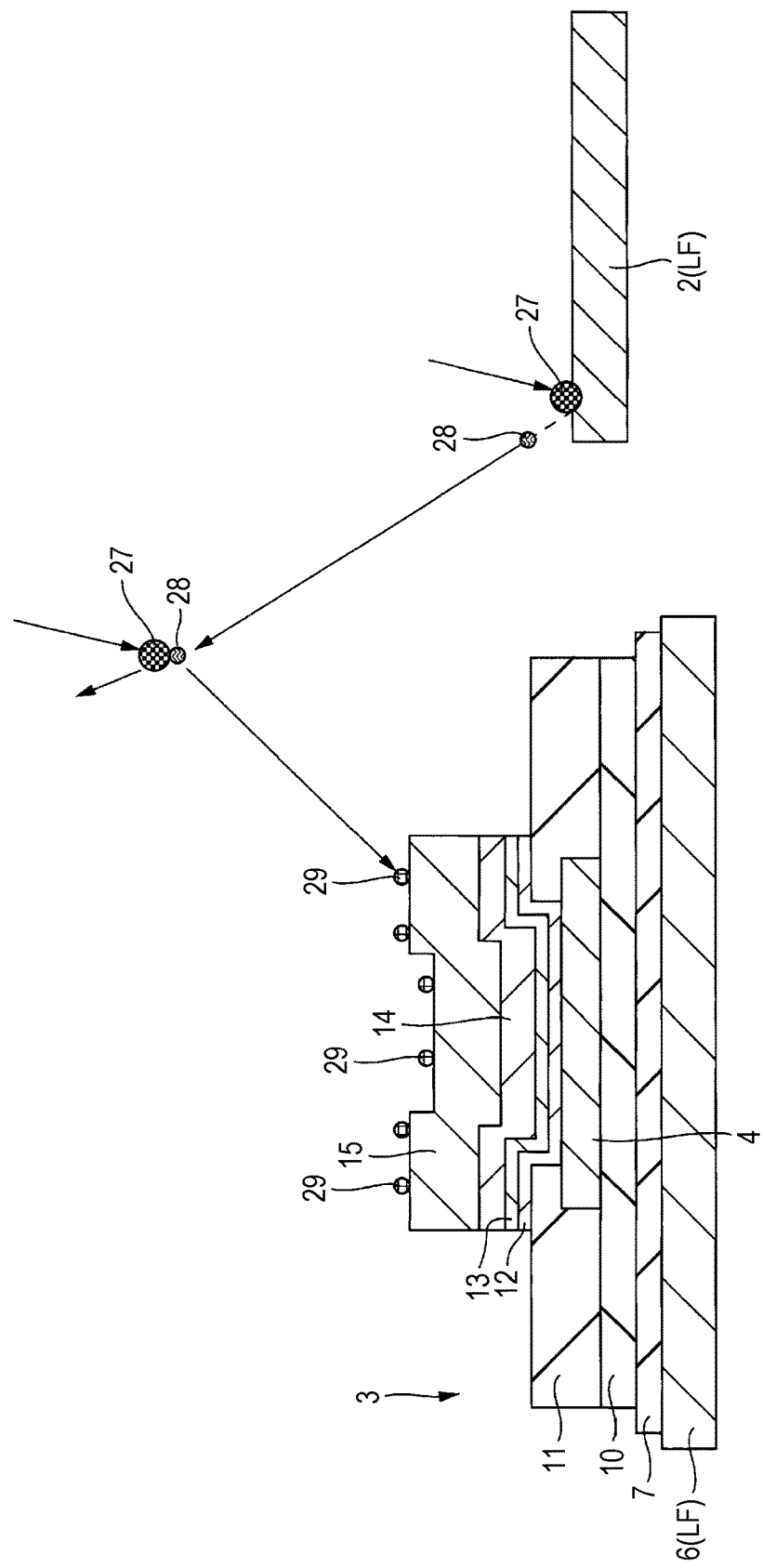
FIG. 25 is a conceptual diagram showing a reaction mechanism at a plasma cleaning step according to the present embodiment.

The problems studied by the present inventors in the steps of the method of manufacturing the semiconductor device described above and the features and effects of the present embodiment that is a means for solving the problems are explained. FIG. 24 is a conceptual diagram showing a reaction mechanism of a conductive layer surface at an etching step according to the present embodiment. FIG. 25 is a conceptual diagram showing a reaction mechanism at a plasma cleaning step according to the present embodiment.

A. With Regard to Contamination at Surface of Conductive Layer

The present inventors have studied contamination at the surface of a conductive layer OP. As stated earlier, at the conductive layer forming step (S2) shown in FIG. 5, as shown in FIG. 4, an insulating film 11 and conductive layers 12, 13, 14, and 15 configuring a conductive layer OP are formed on a pad electrode 4. That is, a bonding wire 5 is bonded to the conductive layer 15.

In general, it is important that the surface of a conductive layer 15 touching a bonding wire 5 is not contaminated at a wire bonding step (S9) in order to improve a bonding strength between the bonding wire 5 and the conductive layer 15. Here, a bonding wire comprised of copper (Cu) is harder than a bonding wire comprised of gold (Au) and has a low adhesiveness to a conductive layer 15 comprising gold. As a result, when a bonding wire comprised of copper is used in particular, it is important that the surface of a conductive layer 15 touching a bonding wire 5 is not contaminated. Between a conductive layer forming step (S2) and a wire bonding step (S9) however, a photoresist film removing step (S4) to remove a photoresist film PR1, a conductive layer etching step (S5) to remove an unnecessary conductive layer 12a and an unnecessary conductive layer 13a, a wafer dicing step (S6), a die bonding step (S7), and other steps are applied. Consequently, the possibility that the surface of a conductive layer 15 formed at the conductive layer forming step (S2) is contaminated before a bonding wire 5 is connected with the conductive layer 15 exists not a little.

Firstly therefore, the present inventors have studied contamination at the surface of a conductive layer 15 at the conductive layer etching step (S5) shown in FIG. 5. As an example of the studies, a semiconductor device manufactured by not applying an iodine protective film forming step (S3) after a conductive layer forming step (S2) and not forming a protective film 18 comprised of iodine on the surface of a conductive layer 15 is explained.

At a conductive layer etching step (S5), a wet etching method is used for selectively removing an unnecessary conductive layer 13a and an unnecessary conductive layer 12a. A mixed solution of sulfuric acid and a hydrogen peroxide solution is used as an etching liquid of the conductive layer 13a comprised of copper and the conductive layer 12a comprised of titanium.

As shown in FIG. 24, when a semiconductor wafer WF is immersed in an etching liquid 20, copper configuring a conductive layer 13a is etched first and copper ions 21 are eluted in the etching liquid 20. On this occasion, many of electrons 22 generated when the copper ions 21 are etched react with hydrogen peroxide (not shown in the figure) in the solution. Some of the electrons 22 generated when the copper ions 21 are etched, however, move to the surface of a conductive layer 15 electrically connected with the conductive layer 13a through a conductive layer 14. As a result, the copper ions 21 receive the electrons 22 again at the surface of the conductive layer 15 and copper precipitates on the surface of the conductive layer 15. The precipitated copper is formed finally as a contamination precipitated film 26 comprised of copper in a planar shape (in layers) on the surface of the conductive layer 15.

Further, as shown in FIG. 24, nickel configuring a conductive layer 14 that is a part of a conductive layer OP: has a larger ionization tendency than copper; and hence is likely to be etched by an etching liquid 20. As a result, the conductive layer 14 is etched by the etching liquid 20 and nickel ions 23 are eluted. Electrons 24 generated when nickel is etched move to the surface of a conductive layer 15 electrically connected with the conductive layer 14. On this occasion, in the ions existing in the solution, copper ions 21 having the smallest ionization tendency in the original metals receive the electrons 24 at the surface of the conductive layer 15 and copper 25 precipitates. The precipitated copper 25 is formed finally as a contamination precipitated film 26 of copper in a planar shape (in layers) on the surface of the conductive layer 15 in the same manner as above.

In this way, the contamination precipitated film 26 is formed on the surface of the conductive layer 15 by etching the conductive layer 13a. In particular, as stated earlier, when a conductive layer 14 comprised of metal (for example, nickel) having a smaller ionization tendency than a metal (for example, copper) configuring the conductive layer 13a exists between the conductive layer 15 and the conductive layer 13a, the formation of the contamination precipitated film 26 is accelerated. The present inventors have confirmed that the thickness of the contamination precipitated film 26 reaches about 2 nm.

The formed contamination precipitated film 26: is formed in layers (in a planar shape) when the thickness is large; and hence can hardly be removed even by argon plasma cleaning at a plasma cleaning step (S8) before wire bonding. As a result, the problem of deteriorating a bonding strength between a bonding wire 5 and a conductive layer 15 because of the contamination precipitated film 26 has arisen. The contamination of the surface of a conductive layer 15 at a conductive layer etching step (S5) and the influence of the contamination are as described above.

Successively, the present inventors have studied contamination at the surface of a conductive layer 15 at a photoresist film removing step (S4) shown in FIG. 5. At the photoresist film removing step (S4), a wet etching method is used for selectively removing a photoresist film PR1. An organic acid is used as the etching liquid of the photoresist film PR1. Here, it sometimes happens that a part of a conductive layer 13a is also etched by an organic acid after a photoresist film PR1 is removed and copper configuring the conductive layer 13a is eluted as copper ions, namely over-etching occurs.

On this occasion, since the conductive layer 13a and a conductive layer 15 are electrically connected, electrons generated at the etching move to the surface of the conductive layer 15 and the eluted copper ions precipitate as copper at the surface of the conductive layer 15. As a result, it has been concerned that a contamination precipitated film 26 may be formed also at a photoresist film removing step (S4) in the same manner as the conductive layer etching step (S5).

Further, it has been concerned that, also at a wafer dicing step (S6) shown in FIG. 5, when a semiconductor wafer WF is cut with a dicing blade DB as shown in FIG. 18, the surface of a conductive layer 15 may be contaminated by cutting water blown against the surface of a conductive layer OP.

Another problem has been that, at a resin sealing step (S10) shown in FIG. 5, when a bonding strength between a bonding wire 5 and a conductive layer 15 deteriorates by the contamination of the surface of the conductive layer 15, the bonding wire 5 exfoliates from the surface of the conductive layer 15 by a filling pressure of a resin.

It is therefore desired for a semiconductor chip having a pad electrode to: prevent the surface of a conductive layer comprised of a metal layer formed on the pad electrode from being contaminated; and improve a bonding strength between a wire and the conductive layer.

B. With Regard to Formation of Protective Film

Figure 15:
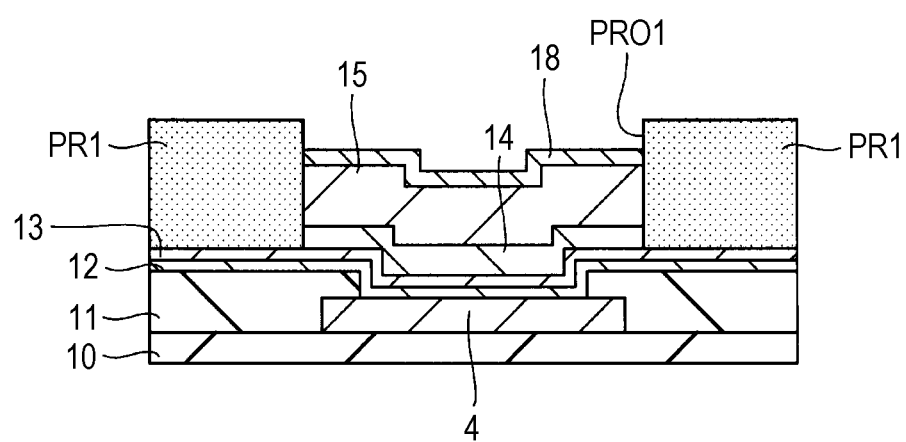
FIG. 15 is a sectional view of the semiconductor device during a manufacturing step subsequent to FIG. 14.

Successively, the formation of a protective film 18 according to the present embodiment is explained. It has been generally known that the surface of a precious metal such as gold is likely to adsorb various atoms and molecules for the stabilization of a surface energy. In the present embodiment therefore, as shown in FIG. 14, at an iodine protective film forming step (S3), by exposing a semiconductor wafer WF in an iodine atmosphere, iodine ($I_2$) adsorbs to the surface of gold configuring a conductive layer 15 and a protective film 18 comprised of iodine is formed on the surface of the conductive layer 15 as shown in FIG. 15.

The iodine adsorbing to the surface of gold is not damaged by an organic acid used as an etching liquid at a photoresist film removing step (S4), a mixed solution of sulfuric acid and a hydrogen peroxide solution used as an etching liquid at a conductive layer etching step (S5), cutting water at a wafer dicing step (S6), and heat (temperature) at a die bonding step (S7). The protective film 18 covering a conductive layer 15 therefore is required not to exfoliate at the photoresist film removing step (S4), the conductive layer etching step (S5), the wafer dicing step (S6), and the die bonding step (S7) and iodine has a high durability against liquid treatment such as a wet etching method as stated earlier and is very suitable as the protective film 18.

That is, at the liquid treatment stated above, the surface of the conductive layer 15 is covered with the protective film 18 and hence is not exposed. For example, at the conductive layer etching step (S5), in order to form a contamination precipitated film 26 on the surface of the conductive layer 15, eluted copper ions 21 are required to receive electrons 24 at the surface of the conductive layer 15 according to the aforementioned mechanism. By forming a protective film 18 beforehand however, since the conductive layer 15 is not exposed during the liquid treatment, the copper ions 21 in the solution cannot receive electrons 24 from the conductive layer 15. As a result, copper 25 does not precipitate and a contamination precipitated film 26 is not formed on the surface of the conductive layer 15.

In this way, the surface of a conductive layer 15 is protected by a protective film 18 and the contamination of the conductive layer 15 caused at the conductive layer forming step (S2) and succeeding steps can be prevented.

Here, as stated earlier, a protective film 18 according to the present, embodiment, is formed under the conditions of an iodine gas partial pressure of about 100 Pa and an exposure time of 600 seconds. On this occasion, the protective film 18 is formed as an iodine adsorption film of a monolayer.

On this occasion too, iodine adsorbing to the surface of gold is not damaged by an organic acid, a mixed solution of sulfuric acid and a hydrogen peroxide solution, cutting water, and heat (temperature) at the die bonding step. Even when a protective film 18 comprised of iodine is a monolayer therefore, since the surface of a conductive layer 15 is not exposed during liquid treatment, a contamination precipitated film 26 can be prevented sufficiently from being formed on the surface of the conductive layer 15, for example.

Meanwhile, when a protective film 18 comprised of iodine is a monolayer, the protective film 18 can be removed easily and surely to the extent that the film thickness is thin by argon plasma cleaning at the plasma cleaning step (S8).

In this way, a protective film 18 according to the present embodiment is preferably formed as an iodine adsorption film of a monolayer.

Further, although the explanations have been made on the basis of the case of covering the whole surface of a conductive layer 15 comprised of gold with a protective film 18 comprised of iodine at the iodine protective film forming step (S3) according to the present embodiment, a region where a protective film is formed is not limited to this case. That is, it is also possible to cover a region touched by a part (ball part 5a) of a bonding wire 5, for example, a recess 15a formed in the center of the main surface of a conductive layer 15, or only a first region R1 that is a junction between a ball part 5a of a bonding wire 5 and a conductive layer 15 with a protective film 18 at the wire bonding step (S9) shown in FIG. 5.

If a positional deviation of a wire caused when a bonding wire 5 is connected with the surface of a conductive layer 15 is taken into consideration however, it is desirable to cover the whole surface of a conductive layer 15 comprised of gold with a protective film 18 like the present embodiment.

Further, although the explanations have been made on the basis of the case of introducing iodine in the state of a gas at the iodine protective film forming step (S3) according to the present embodiment, it is also possible to form a protective film 18 by: immersing a semiconductor wafer WF in an iodine-potassium iodide solution; and adsorbing iodine to the outermost surface of a conductive layer 15.

If the influence of an iodine-potassium iodide solution on a photoresist film PR1 and the influence of dissolution and precipitation of other kinds of metals on the contamination of a gold surface are taken into consideration however, the adsorption of iodine to a conductive layer surface by an iodine gas is desirable to the extent of requiring the control of an iodine solution.

Furthermore, although the explanations have been made on the basis of the case of applying the iodine protective film forming step (S3) according to the present embodiment immediately after the conductive layer forming step (S2) as shown in FIG. 5, the iodine protective film forming step (S3) may be applied any time after the conductive layer forming step (S2) before the conductive layer etching step (S5).

Since a contamination precipitated film 26 may possibly be formed on the surface of a conductive layer 15 by over-etching at the photoresist film removing step (S4) shown in FIG. 5 as stated earlier however, it is suitable to apply the iodine protective film forming step (S3) immediately after a conductive layer 15 is formed at the conductive layer forming step (S2) like the present embodiment. That is, by applying the iodine protective film forming step (S3) before the photoresist film removing step (S4), contamination at the surface of a conductive layer 15 at the photoresist film removing step (S4) can also be prevented without fail.

C. With Regard to Removal of Protective Film

Successively, the removal of a protective film 18 according to the present embodiment is explained. It has been generally known that, through a heat treatment step in the die bonding step (S7) shown in FIG. 5, a substance such as a nitrogen compound: evaporates from a bonding layer 7; attaches to the surface of a pad electrode 4 or a conductive layer OP; and contaminates the surface. In order to prevent bonding failure between a wire and a pad electrode 4 or a conductive layer OP therefore, plasma cleaning shown in FIG. 20 is applied as the plasma cleaning step (S8) shown in FIG. 5 before wire bonding. The plasma cleaning is a cleaning method of: ionizing a noble gas such as argon by plasma; irradiating a substrate surface; thus ejecting surface atoms by the noble gas; and cleaning the substrate surface.

At the plasma cleaning step (S8) according to the present embodiment, as shown in FIG. 20, when the surface of a conductive layer OP is irradiated with argon ions, the argon ions collide with iodine molecules in a protective film 18 and gold atoms in a conductive layer 15 and the iodine molecules and the gold atoms are ejected from the surface of the conductive layer 15. As a result, the protective film 18 is removed and a clean gold surface is formed. At the plasma cleaning step (S8) according to the present embodiment, argon plasma cleaning is applied under the conditions of an argon gas partial pressure of about 15 Pa, an electric power of 200 W, and an irradiation time of 10 seconds. Through the step, a protective film 18 formed on the surface of a conductive layer 15 is removed completely and iodine does not remain at surface of the conductive layer 15.

Iodine therefore: has a high durability against liquid treatment such as a wet etching method as stated earlier; but can be removed from the surface of a conductive layer 15 easily and surely at the plasma cleaning step (S8) applied generally before the wire bonding step (S9); and is very suitable as a protective In this way, a conductive layer 15 over a semiconductor wafer WF can be kept clean at the wire bonding step (S9). As a result, a bonding strength between a bonding wire 5 and a conductive layer 15 can be improved. Further, another step for removing a protective film 18 is not required to be added to the manufacturing step of a semiconductor device, the throughput of a semiconductor device improves, and the manufacturing cost of a semiconductor device can be reduced.

Further, in the present embodiment, contamination caused at the steps after the conductive layer forming step (S2) before the wire bonding step (S9) can be prevented by applying the plasma cleaning step (S8) immediately before the wire bonding step (S9) and as a result a bonding strength between a bonding wire 5 and a conductive layer 15 can be improved effectively.

Furthermore, as a result of improving a bonding strength between a bonding wire 5 and a conductive layer 15, at the resin sealing step (S10) shown in FIG. 5, the situation that a bonding wire 5 exfoliates from the surface of a conductive layer 15 by a filling pressure of a resin can be prevented without fail.

Moreover, even when foreign matters such as an organic matter configuring a photoresist film and copper configuring a feed layer attach to the surface of a protective film 18, they can be removed from the surface of a conductive layer 15 together with the protective film 18 at the plasma cleaning step (S8).

D. With Regard to Influence of Copper at Plasma Cleaning Step

Here, the possibility of contaminating the surface of a conductive layer OP at the plasma cleaning step (S8) is explained. FIG. 25 is a conceptual diagram showing a reaction mechanism at the plasma cleaning step (S8) according to the present embodiment.

In the present embodiment, as shown in FIG. 25, a semiconductor chip 3 having a pad electrode 4 on which a conductive layer OP is formed is fixed over a die pad 6 of a lead frame LF comprised of a material mainly composed of copper via a bonding layer 7. When the plasma cleaning step (S8) is applied therefore, the lead frame LF is irradiated with argon ions 27, copper atoms or copper ions 28 configuring the lead frame LF are sputtered and discharged into a chamber.

Although the probability that discharged copper attaches to a substrate surface is generally low, when the pressure of an argon gas is high, there is the possibility that argon ions 27 collide with discharged copper atoms or copper ions 28 (re-sputtering) and the re-sputtered copper 29 attaches to the surface of a conductive layer OP. The re-sputtered copper 29, however, is interspersed on the surface of the conductive layer OP and causes only spot-like contamination as shown in FIG. 25, That is, the re-sputtered copper 29 does not precipitate on the surface of a conductive layer 15 in layers (in a planar shape) unlike an aforementioned contamination precipitated film 26. As a result, it can be said that attachment of copper to the surface of a conductive layer OP caused at the plasma cleaning step (S8) does not hinder wire bonding.

Here, at the plasma cleaning step (S8), although the pressure of an argon gas is usually about 15 Pa, it is also possible to reduce the pressure of an argon gas to about 8 Pa, for example and apply the step under the condition of a high vacuum in which the probability of re-sputtering is low in order to reduce contamination at the surface of a conductive layer OP caused by the re-sputtered copper. Even on this occasion, a protective film 18 formed on the surface of a conductive layer 15 is removed completely under the conditions of an electric power of 200 W and an irradiation time of 10 seconds and iodine does not remain at the surface of the conductive layer 15.

Although the invention established by the present inventors has heretofore been explained concretely on the basis of the embodiment, it goes without saying that the present invention is not limited to the embodiment and can be modified variously within the range not departing from the tenor of the present invention. Several modified examples are shown hereunder but it is also possible to combine the modified examples appropriately,

MODIFIED EXAMPLE 1

Although explanations are made on the basis of the case of forming a conductive layer 14 as a stress relieving layer and a conductive layer 15 as a bonding layer at a position overlapping with a pad electrode 4 including a part (part exposed in an opening of an insulating film) of the pad electrode 4 as shown in FIG. 4 in the embodiment, conductive layers 14 and 15 may be formed also in a region not overlapping with a pad electrode 4 in the thickness direction as modified example 1.

Figure 26:
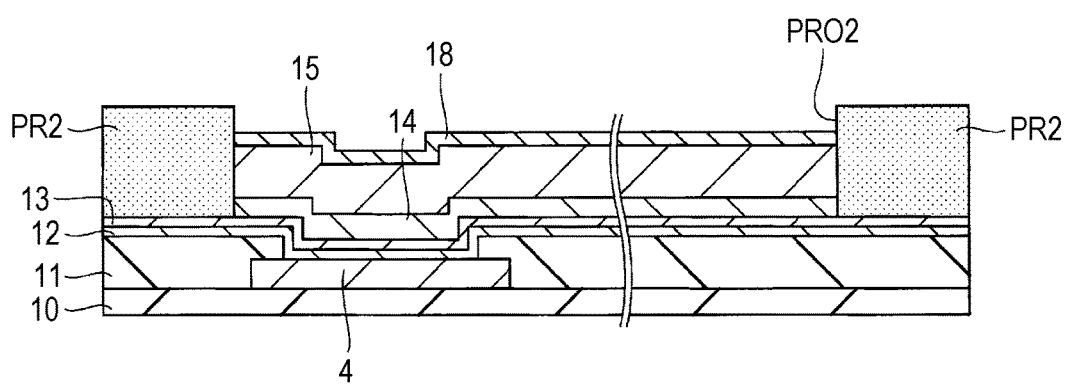
FIG. 26 is a sectional view of a semiconductor device during a manufacturing step according to modified example 1.
Figure 27:
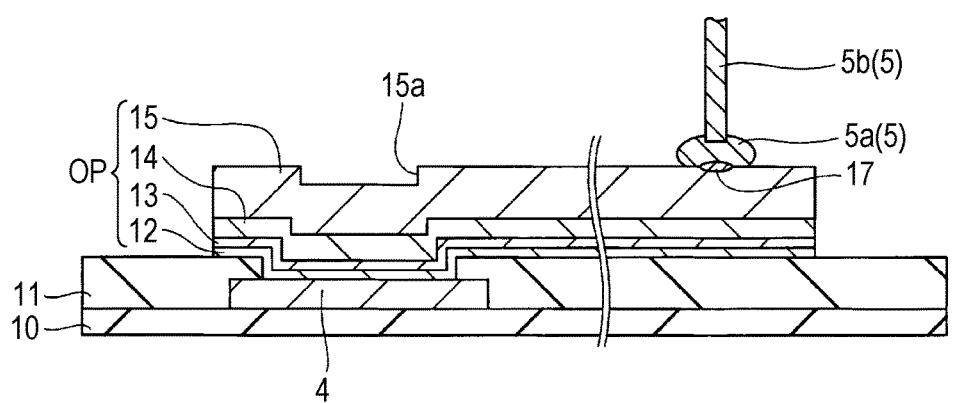
FIG. 27 is a sectional view of the semiconductor device during a manufacturing step subsequent to FIG. 26 according to modified example 1.

FIG. 26 is a sectional view of a semiconductor device during a manufacturing step according to modified example 1. As shown in FIGS. 26 and 27, in a semiconductor device according to modified example 1, the region where a conductive layer OP is formed is expanded up to a region not overlapping with a pad electrode 4 in the thickness direction. A method of manufacturing a semiconductor device according to modified example 1 is explained hereunder.

At a conductive layer forming step (S2) according to the embodiment shown in FIG. 5, a photoresist film PR2 having an opening PRO2 is formed on a conductive layer 13 after a conductive layer 12 and the conductive layer 13 are formed as shown in FIG. 26. As shown in FIG. 26, the opening PRO2 is formed so as to open up to a region not overlapping with a pad electrode 4 in addition to a region overlapping with the pad electrode 4 in the thickness direction.

Successively, conductive layers 14 and 15 are formed selectively in the opening PRO2 by an electrolytic plating method. As a result, as shown in FIG. 26, a conductive layer OP is connected with the pad electrode 4 and formed so as to extend on an insulating film 11.

Successively, by applying an iodine protective film forming step (S3) shown in FIG. 5, as shown in FIG. 26, a protective film 18 comprised of iodine is formed on the surface of the conductive layer 15 comprised of gold similarly to the embodiment.

Successively, a photoresist film removing step (S4), a conductive layer etching step (S5), a wafer dicing step (S6), and a die bonding step (S7) shown in FIG. 5 are applied similarly to the embodiment.

Successively, by applying a plasma cleaning step (S8) shown in FIG. 5, as shown in FIG. 27, the protective film 18 comprised of iodine is removed and a clean gold surface of the conductive layer 15 that is the outermost surface of the conductive layer OP is formed.

Successively, a wire bonding step (S9) shown in FIG. 5 is applied. In modified example 1, as shown in FIG. 27, in a region not overlapping with the pad electrode 4 in the thickness direction, the conductive layer OP extending on the insulating film 11 is connected with a ball part 5a of a bonding wire 5 and an alloy layer 17 is formed. As a result, the ball part 5a of the bonding wire 5 is connected with the pad electrode 4 through the conductive layer OP and the other end of the wire part 5b is connected with a lead.

Here, the conductive layer OP connected with the pad electrode 4 may extend on a polyimide layer PI in FIG. 3. On this occasion, a ball part 5a of a bonding wire 5 is connected with the conductive layer OP on the polyimide layer PI and an alloy layer 17 is formed.

In this way, as shown in FIGS. 26 and 27, as a method of manufacturing a semiconductor device according to modified example 1, similarly to the embodiment, the surface of a conductive layer OP can be protected by: applying an iodine protective film forming step to the conductive layer OP; adsorbing iodine to the surface of the conductive layer OP; and forming a protective film comprised of iodine. As a result, contamination caused at the conductive layer forming step (S2) and succeeding steps can be prevented and, in a semiconductor chip having a pad electrode, it is possible to: prevent not only the surface of a conductive layer formed on a pad electrode but also the surface of a conductor layer formed in a region not overlapping with the pad electrode from contaminating; and improve even a bonding strength between a bonding wire 5 and a conductive layer OP connected in the region not overlapping with the pad electrode.

Modified example 1 can be applied to a technology of completing packaging in a wafer state, a so-called wafer process package (WPP), by integrating a packaging process (latter process) and a wafer process (former process), for example.

MODIFIED EXAMPLE 2

Modified example 2 is the case of installing a semiconductor chip according to the embodiment in a BGA package and the explanations are made on the basis of the embodiment.

Figure 28:
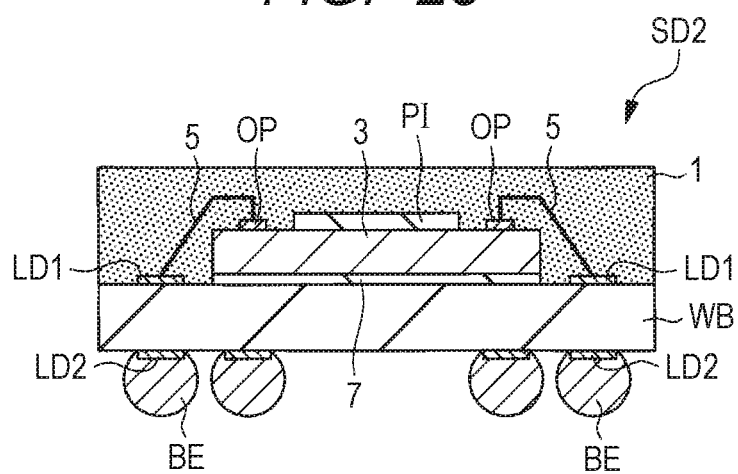
FIG. 28 is a sectional view of a semiconductor device according to modified example 2.

FIG. 28 is a sectional view of a semiconductor device according to modified example 2. A semiconductor device SD2 according to modified example 2 has a wiring board WB that is a resin substrate of a glass epoxy series as a base material, a semiconductor chip 3, a sealing body 1, and solder balls BE that are external terminals. The semiconductor chip 3 is mounted on the main surface of the wiring board WB via a bonding layer 7 and a plurality of conductive layers OP formed over the main surface of the semiconductor chip 3 are connected with terminal electrodes LD1 formed on the main surface of the wiring board WB through bonding wires 5.

A polyimide layer PI is formed over the main surface of the semiconductor chip 3 and the semiconductor chip 3, the polyimide layer PI, the conductive layers OP, the bonding wires 5, and the terminal electrodes LD1 are covered with the sealing body 1. Further, a plurality of terminal electrodes LD2 electrically connected with the terminal electrodes LD1 respectively are formed on the back surface of the wiring board WB and the solder balls BE are connected with the terminal electrodes LD2 respectively.

As a method of manufacturing a semiconductor device according to modified example 2 shown in FIG. 28, the surface of a conductive layer OP can be protected similarly to the embodiment by: applying an iodine protective film forming step to the conductive layer OP; adsorbing iodine to the surface of the conductive layer OP; and forming a protective film comprised of iodine. As a result, contamination caused at a conductive layer forming step (S2) and succeeding steps can be prevented and, in a semiconductor chip having a pad electrode, it is possible to: prevent the surface of a conductive layer comprised of a metal layer formed on the pad electrode from being contaminated; and improve a bonding strength between a bonding wire 5 and a conductive layer OP.

Further, when a resin substrate of a glass epoxy series is used as a base material, unlike a lead frame LF, a gas component may undesirably be generated from the substrate (concretely the resin configuring the substrate) by the influence of heat (temperature) applied at a die bonding step. Then the surface of a conductive layer OP may sometimes be contaminated also by the generated gas component.

By covering the surface of a conductive layer OP with a protective film comprised of iodine beforehand as stated earlier however, contamination caused by the gas component can also be inhibited.

Although the invention established by the present inventors has heretofore been explained concretely on the basis of the embodiment, it goes without saying that the present invention is not limited to the embodiment and can be modified variously within the range not departing from the tenor of the present invention.

What is claimed is:

1. A method of manufacturing a semiconductor device, comprising the steps of:
   (a) providing a semiconductor wafer having a first surface, a pad electrode formed on the first surface, a first insulating film formed on the first surface and having a first opening through which a part of the pad electrode is exposed, a first conductive layer formed on a surface of the first insulating film and electrically connected with the pad electrode through an inner side of the first opening, a second insulating film formed on a surface of the first conductive layer and having a second opening through which a part of the first conductive layer is exposed, and a second conductive layer formed on the surface of the first conductive layer in the second opening;
   (b) after the step (a), removing the second insulating film,
   (c) after the step (b), removing a part of the first conductive layer not overlapping with the second conductive layer;
   (d) after the step (c), mounting a semiconductor chip obtained by cutting the semiconductor wafer on a base material via a die bonding material;
   (e) after the step (d), irradiating the semiconductor chip with argon ions; and
   (f) after the step (e), bringing a part of a bonding wire into contact with a surface of the second conductive layer of the semiconductor chip,
   wherein, before the step (c), a protective film comprised of iodine is formed on the surface of the second conductive layer, and
   wherein the protective film is removed at the step (e).

2. The method of manufacturing a semiconductor device according to claim 1, wherein the protective film is formed before the step (b).

3. The method of manufacturing a semiconductor device according to claim 1, wherein the protective film is formed after the step (b) before the step (c).

4. The method of manufacturing a semiconductor device according to claim 1:
   wherein the first conductive layer comprises copper; and
   wherein the step (b) is applied by a wet etching method.

5. The method of manufacturing a semiconductor device according to claim 1:
   wherein the first conductive layer comprises copper; and
   wherein the step (c) is applied by a wet etching method.

6. The method of manufacturing a semiconductor device according to claim 1:
   wherein the surface of the second conductive layer has a first region touching a part of the bonding wire and a second region other than the first region; and
   wherein the protective film is formed selectively at the first region.

7. The method of manufacturing a semiconductor device according to claim 1:
   wherein the semiconductor wafer provided at the step (a) has a third conductive layer formed on the surface of the first conductive layer in the second opening; and
   wherein the second conductive layer is formed on the surface of the third conductive layer.

8. The method of manufacturing a semiconductor device according to claim 7:
   wherein the semiconductor wafer provided at the step (a) is formed on the surface of the first insulating film and has a fourth conductive layer electrically connected with the pad electrode through the inner side of the first opening;
   wherein the first conductive layer is formed on a surface of the fourth conductive layer; and
   wherein the method further comprises the step of:
   (g) removing a part of the fourth conductive layer not overlapping with the second conductive layer after the step (c) before the step (d).

9. The method of manufacturing a semiconductor device according to claim 8, wherein the fourth conductive layer comprises titanium.

10. The method of manufacturing a semiconductor device according to claim 7, wherein the third conductive layer comprises nickel.

11. The method of manufacturing a semiconductor device according to claim 1, further comprising the step of:
    (h) sealing the semiconductor chip and the bonding wire with a resin after the step (f).

12. The method of manufacturing a semiconductor device according to claim 1, wherein the protective film comprises an iodine adsorption film of a monolayer.

13. The method of manufacturing a semiconductor device according to claim 1, wherein the protective film is formed by exposing the semiconductor wafer in an iodine gas atmosphere.

14. The method of manufacturing a semiconductor device according to claim 1, wherein the protective film is formed by immersing the semiconductor wafer in an iodine-potassium iodide solution.

15. The method of manufacturing a semiconductor device according to claim 1, wherein a part of the bonding wire is brought into contact with a region of the surface of the second conductive layer overlapping with the pad electrode in the thickness direction at the step (f).

16. The method of manufacturing a semiconductor device according to claim 1:
    wherein the second opening exposes both a region of the first conductive layer overlapping with the pad electrode in the thickness direction and a region of the first conductive layer not overlapping with the pad electrode in the thickness direction; and
    wherein a part of the bonding wire is brought into contact with a region of the surface of the second conductive layer not overlapping with the pad electrode in the thickness direction at the step (f).

17. The method of manufacturing a semiconductor device according to claim 1:
    wherein the base material is a lead frame; and
    wherein the second conductive layer of the semiconductor chip is connected with a lead of the lead frame through the bonding wire at the step (f).

18. The method of manufacturing a semiconductor device according to claim 1:
    wherein the base material is a wiring board; and
    wherein the second conductive layer of the semiconductor chip is connected with a terminal electrode formed at the main surface of the wiring board through the bonding wire at the step (f).

19. The method of manufacturing a semiconductor device according to claim 1, wherein the second conductive layer comprises gold.

20. The method of manufacturing a semiconductor device according to claim 1, wherein the semiconductor chip and the base material on which the semiconductor chip is mounted are irradiated with argon ions at the step (e).

* * * * *